(12) United States Patent
Kim et al.

(10) Patent No.: US 9,779,465 B2
(45) Date of Patent: Oct. 3, 2017

(54) APPARATUS AND METHOD FOR IMPLEMENTING POWER SAVING TECHNIQUES WHEN PROCESSING FLOATING POINT VALUES

(71) Applicant: Intel Corporation, Santa Clara, CA (US)

(72) Inventors: Young Moon Kim, Hillsboro, OR (US); Sang Phill Park, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 60 days.

(21) Appl. No.: 14/581,600

(22) Filed: Dec. 23, 2014

(65) Prior Publication Data

US 2016/0180489 A1 Jun. 23, 2016

(51) Int. Cl.
*G06T 1/20* (2006.01)
*G09G 5/00* (2006.01)
*H03M 13/11* (2006.01)

(52) U.S. Cl.
CPC ............... *G06T 1/20* (2013.01); *G09G 5/00* (2013.01); *G09G 2330/021* (2013.01); *H03M 13/1108* (2013.01)

(58) Field of Classification Search
None
See application file for complete search history.

(56) References Cited

U.S. PATENT DOCUMENTS

| | | | | |
|---|---|---|---|---|
| 6,608,779 B1* | 8/2003 | Burgess, Jr. | ......... | G11C 7/1006 365/189.02 |
| 6,633,970 B1* | 10/2003 | Clift | ....................... | G06F 9/384 712/217 |
| 7,363,464 B2* | 4/2008 | Liron | .................... | G06F 1/3225 711/208 |
| 2004/0186870 A1 | 9/2004 | Dhong et al. | | |
| 2012/0284548 A1 | 11/2012 | Barowski et al. | | |
| 2014/0143564 A1* | 5/2014 | Tannenbaum | ........ | G06F 7/4876 713/320 |
| 2014/0160862 A1 | 6/2014 | Terariol et al. | | |
| 2014/0355665 A1* | 12/2014 | Wegener | .............. | H04N 19/127 375/240.02 |

(Continued)

OTHER PUBLICATIONS

Transmittal of the International Search Report and the Written Opinion of the International Searching Authority from Patent Cooperation Treaty Application No. PCT/US2015/062067, mailed Mar. 18, 2016, 13 pages.

(Continued)

*Primary Examiner* — Xiao Wu
*Assistant Examiner* — Steven Elbinger
(74) *Attorney, Agent, or Firm* — Nicholson De Vos Webster & Elliott LLP

(57) ABSTRACT

An apparatus and method are described for reducing power when reading and writing graphics data. For example, one embodiment of an apparatus comprises: a graphics processor unit (GPU) to process graphics data including floating point data; a set of registers, at least one of the registers of the set partitioned to store the floating point data; and encode/decode logic to reduce a number of binary 1 values being read from the at least one register by causing a specified set of bit positions within the floating point data to be read out as 0s rather than 1s.

25 Claims, 15 Drawing Sheets

(56) References Cited

U.S. PATENT DOCUMENTS

2015/0212877 A1* 7/2015 Kern .................... G11C 7/1006
714/764
2015/0229325 A1* 8/2015 Hollis ................. G06F 13/4221
710/106

OTHER PUBLICATIONS

International Preliminary Report on Patentability for Application No. PCT/US2015/062067, dated Jul. 6, 2017, 10 pages.

* cited by examiner

FIG. 9A          SAMPLE COMMAND FORMAT
                          900
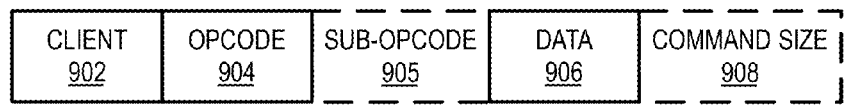
FIG. 9B          SAMPLE COMMAND SEQUENCE
                          910
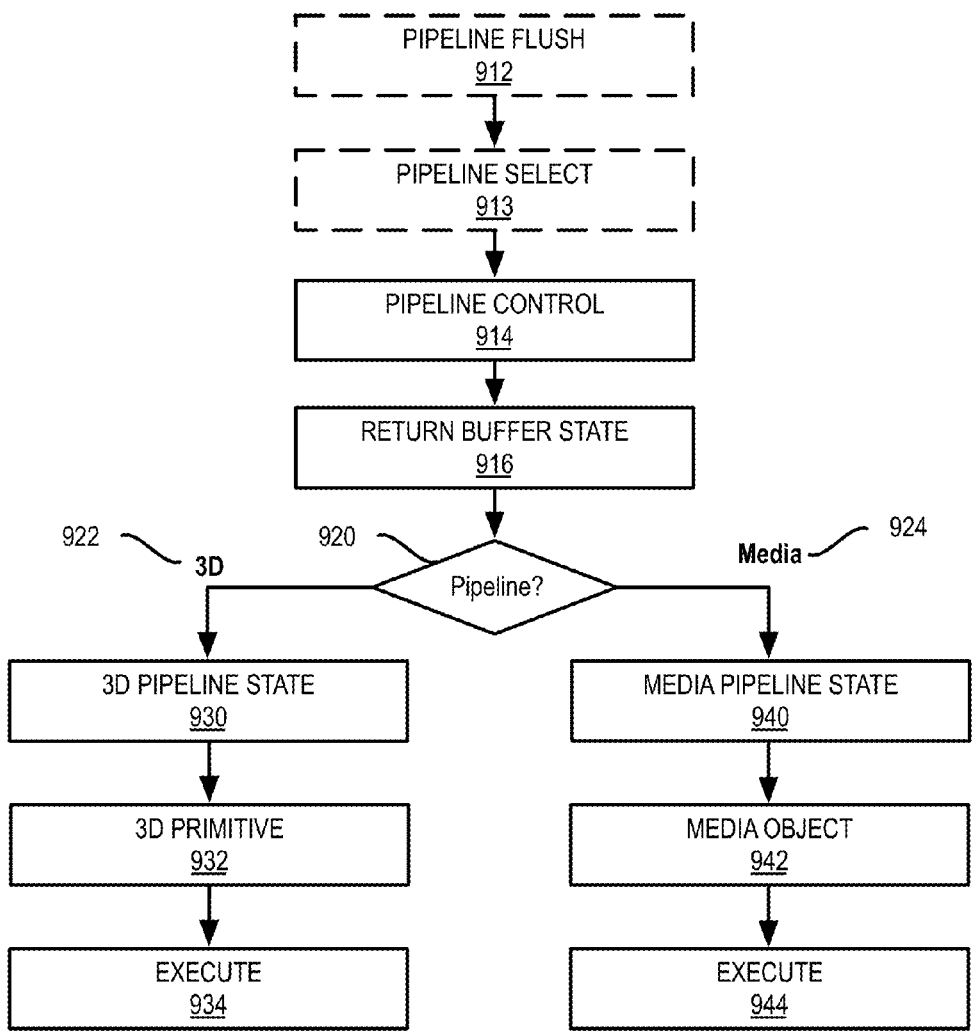

APPARATUS AND METHOD FOR IMPLEMENTING POWER SAVING TECHNIQUES WHEN PROCESSING FLOATING POINT VALUES

This invention was made with Government support under contract number B600738 awarded by the Department of Energy. The Government has certain rights in this invention.

BACKGROUND

Field of the Invention

This invention relates generally to the field of computer processors. More particularly, the invention relates to a method and apparatus for implementing power saving techniques when processing floating point values.

Description of the Related Art

Graphics processors are one of the largest/power critical blocks in current system on a chip (SoC) architectures. Register file (RF) and wide buses consume significant power in graphics processors. In RFs, an operation to read a "1" consumes significantly more power than an operation to read a "0" because of return-to-zero (RZ) domino-style read operations. In addition, writing different values to the RF every cycle can lead to the worst-case power consumption due to large capacitance of write bit lines in non-return-to-zero (NRZ) write operations. Similarly, moving different data on long, wide buses every cycle consumes a large amount of power.

BRIEF DESCRIPTION OF THE DRAWINGS

A better understanding of the present invention can be obtained from the following detailed description in conjunction with the following drawings, in which:

FIG. 9A is a block diagram illustrating a graphics processor command format according to an embodiment;

FIG. 9B is a block diagram illustrating a graphics processor command sequence according to an embodiment;

DETAILED DESCRIPTION

In the following description, for the purposes of explanation, numerous specific details are set forth in order to provide a thorough understanding of the embodiments of the invention described below. It will be apparent, however, to one skilled in the art that the embodiments of the invention may be practiced without some of these specific details. In other instances, well-known structures and devices are shown in block diagram form to avoid obscuring the underlying principles of the embodiments of the invention.

Exemplary Graphics Processor Architectures and Data Types

System Overview

Figure 1:
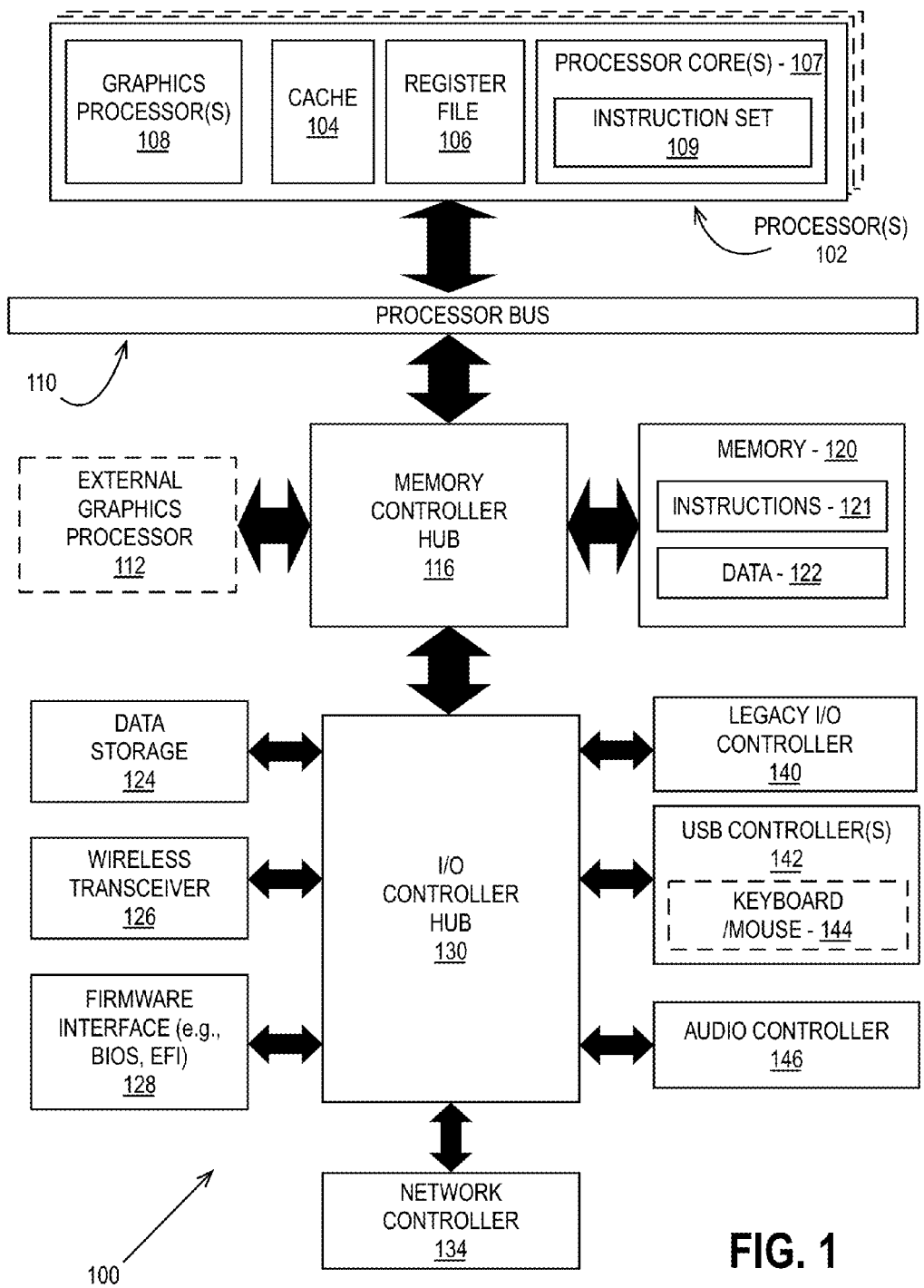
FIG. 1 is a block diagram of an embodiment of a computer system with a processor having one or more processor cores and graphics processors.

FIG. 1 is a block diagram of a data processing system 100, according to an embodiment. Data processing system 100 includes one or more processors 102 and one or more graphics processors 108, and may be a single processor desktop system, a multiprocessor workstation system, or a server system having a large number of processors 102 or processor cores 107. In on embodiment, the data processing system 100 is a system-on-a-chip (SoC) integrated circuit for use in mobile, handheld, or embedded devices.

An embodiment of data processing system 100 can include, or be incorporated within a server-based gaming platform, a game console, including a game and media console, a mobile gaming console, a handheld game console, or an online game console. In some embodiments, data processing system 100 is a mobile phone, smart phone, tablet computing device or mobile Internet device. Data processing system 100 can also include, couple with, or be integrated within a wearable device, such as a smart watch wearable device, smart eyewear device, augmented reality device, or virtual reality device. In some embodiments, data processing system 100 is a television or set top box device having one or more processors 102 and a graphical interface generated by one or more graphics processors 108.

In some embodiments, the one or more processors 102 each include one or more processor cores 107 to process instructions which, when executed, perform operations for system and user software. In some embodiments, each of the one or more processor cores 107 is configured to process a specific instruction set 109. In some embodiments, instruction set 109 may facilitate Complex Instruction Set Computing (CISC), Reduced Instruction Set Computing (RISC), or computing via a Very Long Instruction Word (VLIW). Multiple processor cores 107 may each process a different instruction set 109, which may include instructions to facilitate the emulation of other instruction sets. Processor core 107 may also include other processing devices, such a Digital Signal Processor (DSP).

In some embodiments, the processor 102 includes cache memory 104. Depending on the architecture, the processor 102 can have a single internal cache or multiple levels of internal cache. In some embodiments, the cache memory is shared among various components of the processor 102. In some embodiments, the processor 102 also uses an external cache (e.g., a Level-3 (L3) cache or Last Level Cache (LLC)) (not shown), which may be shared among processor cores 107 using known cache coherency techniques. A register file 106 is additionally included in processor 102 which may include different types of registers for storing different types of data (e.g., integer registers, floating point registers, status registers, and an instruction pointer register). Some registers may be general-purpose registers, while other registers may be specific to the design of the processor 102.

In some embodiments, processor 102 is coupled to a processor bus 110 to transmit data signals between processor 102 and other components in system 100. System 100 uses an exemplary 'hub' system architecture, including a memory controller hub 116 and an input output (I/O) controller hub 130. Memory controller hub 116 facilitates communication between a memory device and other components of system 100, while I/O Controller Hub (ICH) 130 provides connections to I/O devices via a local I/O bus.

Memory device 120 can be a dynamic random access memory (DRAM) device, a static random access memory (SRAM) device, flash memory device, or some other memory device having suitable performance to serve as process memory. Memory 120 can store data 122 and instructions 121 for use when processor 102 executes a process. Memory controller hub 116 also couples with an optional external graphics processor 112, which may communicate with the one or more graphics processors 108 in processors 102 to perform graphics and media operations.

In some embodiments, ICH 130 enables peripherals to connect to memory 120 and processor 102 via a high-speed I/O bus. The I/O peripherals include an audio controller 146, a firmware interface 128, a wireless transceiver 126 (e.g., Wi-Fi, Bluetooth), a data storage device 124 (e.g., hard disk drive, flash memory, etc.), and a legacy I/O controller for coupling legacy (e.g., Personal System 2 (PS/2)) devices to the system. One or more Universal Serial Bus (USB) controllers 142 connect input devices, such as keyboard and mouse 144 combinations. A network controller 134 may also couple to ICH 130. In some embodiments, a high-performance network controller (not shown) couples to processor bus 110.

Figure 2:
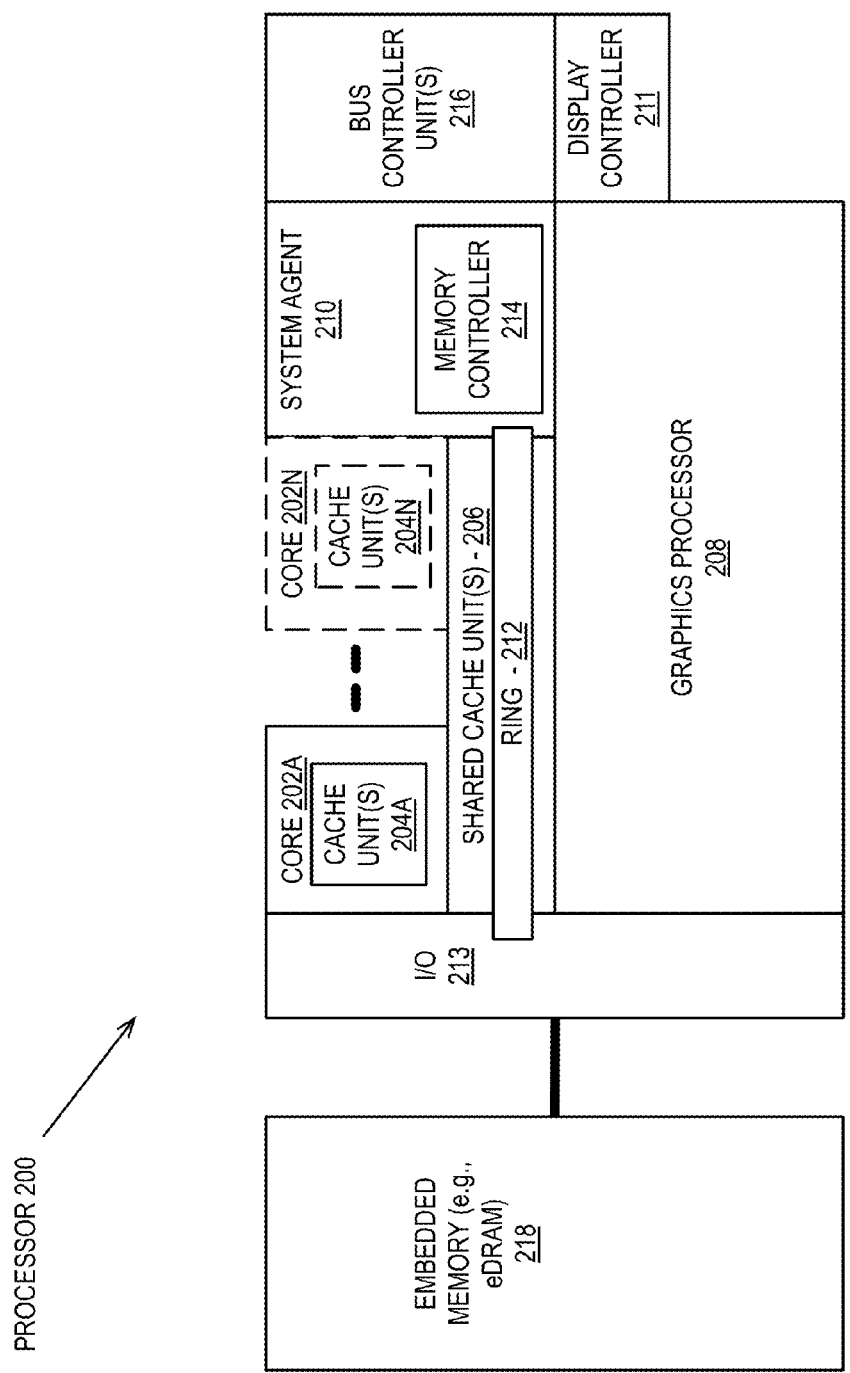
FIG. 2 is a block diagram of one embodiment of a processor having one or more processor cores, an integrated memory controller, and an integrated graphics processor.

FIG. 2 is a block diagram of an embodiment of a processor 200 having one or more processor cores 202A-N, an integrated memory controller 214, and an integrated graphics processor 208. Those elements of FIG. 2 having the same reference numbers (or names) as the elements of any other figure herein can operate or function in any manner similar to that described elsewhere herein, but are not limited to such. Processor 200 can include additional cores up to and including additional core 202N represented by the dashed lined boxes. Each of cores 202A-N includes one or more internal cache units 204A-N. In some embodiments each core also has access to one or more shared cached units 206.

The internal cache units 204A-N and shared cache units 206 represent a cache memory hierarchy within the processor 200. The cache memory hierarchy may include at least one level of instruction and data cache within each core and one or more levels of shared mid-level cache, such as a Level 2 (L2), Level 3 (L3), Level 4 (L4), or other levels of cache, where the highest level of cache before external memory is classified as the LLC. In some embodiments, cache coherency logic maintains coherency between the various cache units 206 and 204A-N.

In some embodiments, processor 200 may also include a set of one or more bus controller units 216 and a system agent 210. The one or more bus controller units manage a set of peripheral buses, such as one or more Peripheral Component Interconnect buses (e.g., PCI, PCI Express). System agent 210 provides management functionality for the various processor components. In some embodiments, system agent 210 includes one or more integrated memory controllers 214 to manage access to various external memory devices (not shown).

In some embodiments, one or more of the cores 202A-N include support for simultaneous multi-threading. In such embodiment, the system agent 210 includes components for coordinating and operating cores 202A-N during multi-threaded processing. System agent 210 may additionally include a power control unit (PCU), which includes logic and components to regulate the power state of cores 202A-N and graphics processor 208.

In some embodiments, processor 200 additionally includes graphics processor 208 to execute graphics processing operations. In some embodiments, the graphics processor 208 couples with the set of shared cache units 206, and the system agent unit 210, including the one or more integrated memory controllers 214. In some embodiments, a display controller 211 is coupled with the graphics processor 208 to drive graphics processor output to one or more coupled displays. In some embodiments, display controller 211 may be separate module coupled with the graphics processor via at least one interconnect, or may be integrated within the graphics processor 208 or system agent 210.

In some embodiments, a ring based interconnect unit 212 is used to couple the internal components of the processor 200. However, an alternative interconnect unit may be used, such as a point-to-point interconnect, a switched interconnect, or other techniques, including techniques well known in the art. In some embodiments, graphics processor 208 couples with the ring interconnect 212 via an I/O link 213.

The exemplary I/O link 213 represents at least one of multiple varieties of I/O interconnects, including an on package I/O interconnect which facilitates communication between various processor components and a high-performance embedded memory module 218, such as an eDRAM module. In some embodiments, each of the cores 202-N and graphics processor 208 use embedded memory modules 218 as a shared Last Level Cache.

In some embodiments, cores 202A-N are homogenous cores executing the same instruction set architecture. In another embodiment, cores 202A-N are heterogeneous in terms of instruction set architecture (ISA), where one or more of cores 202A-N execute a first instruction set, while at least one of the other cores executes a subset of the first instruction set or a different instruction set.

In some embodiments, processor 200 is a part of, or implemented on, one or more substrates using any of a number of process technologies, for example, Complementary metal-oxide-semiconductor (CMOS), Bipolar Junction/Complementary metal-oxide-semiconductor (BiCMOS) or N-type metal-oxide-semiconductor logic (NMOS). Additionally, processor 200 can be implemented on one or more chips or as an SoC integrated circuit having the illustrated components, in addition to other components.

Figure 3:
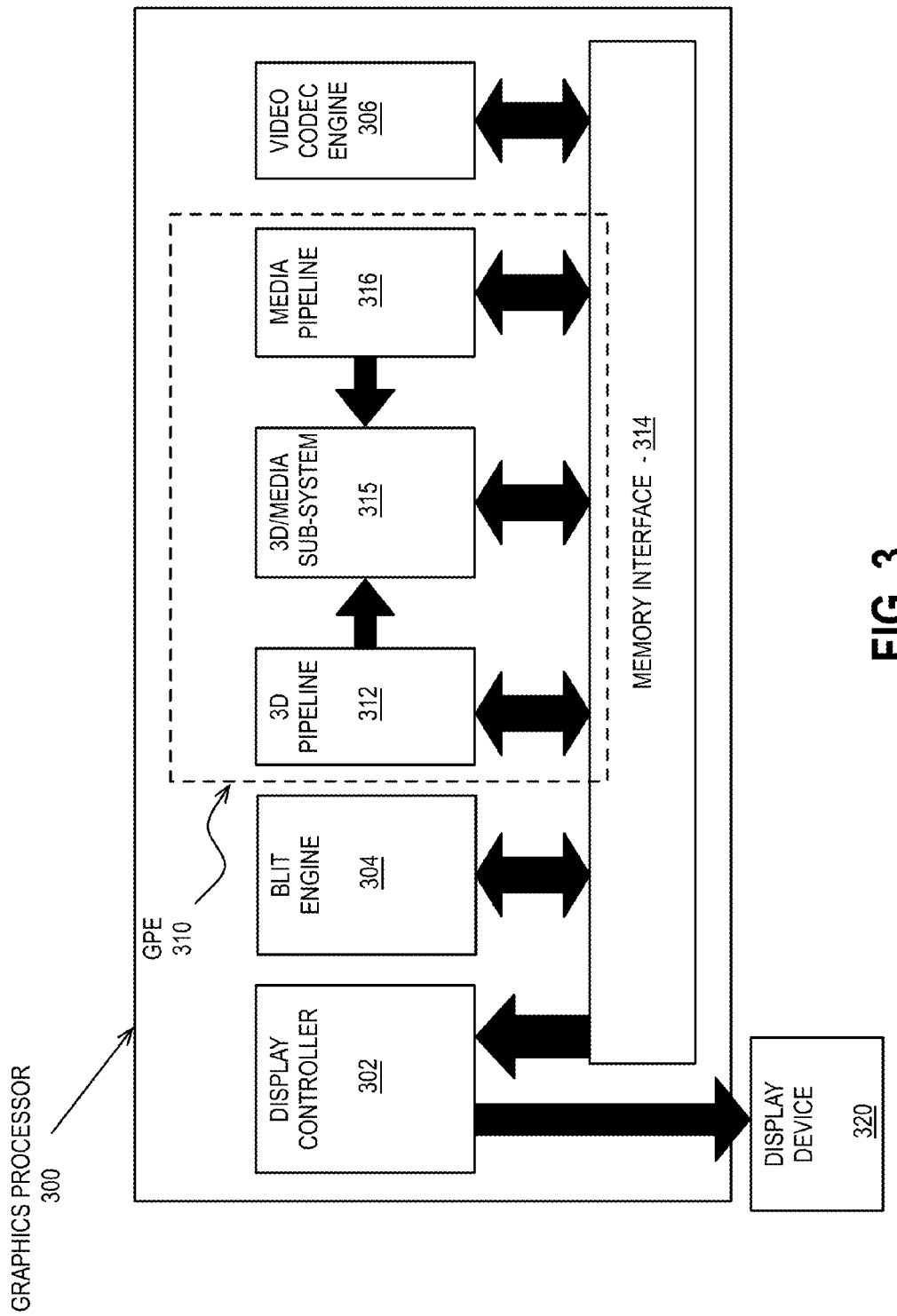
FIG. 3 is a block diagram of one embodiment of a graphics processor which may be a discreet graphics processing unit, or may be graphics processor integrated with a plurality of processing cores.

FIG. 3 is a block diagram of a graphics processor 300, which may be a discrete graphics processing unit, or may be a graphics processor integrated with a plurality of processing cores. In some embodiments, the graphics processor communicates via a memory mapped I/O interface to registers on the graphics processor and with commands placed into the processor memory. In some embodiments, graphics processor 300 includes a memory interface 314 to access memory. Memory interface 314 can be an interface to local memory, one or more internal caches, one or more shared external caches, and/or to system memory.

In some embodiments, graphics processor 300 also includes a display controller 302 to drive display output data to a display device 320. Display controller 302 includes hardware for one or more overlay planes for the display and composition of multiple layers of video or user interface elements. In some embodiments, graphics processor 300 includes a video codec engine 306 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, as well as the Society of Motion Picture & Television Engineers (SMPTE) 421M/VC-1, and Joint Photographic Experts Group (JPEG) formats such as JPEG, and Motion JPEG (MJPEG) formats.

In some embodiments, graphics processor 300 includes a block image transfer (BLIT) engine 304 to perform two-dimensional (2D) rasterizer operations including, for example, bit-boundary block transfers. However, in one embodiment, 2D graphics operations are performed using one or more components of the graphics-processing engine (GPE) 310. In some embodiments, graphics-processing engine 310 is a compute engine for performing graphics operations, including three-dimensional (3D) graphics operations and media operations.

In some embodiments, GPE 310 includes a 3D pipeline 312 for performing 3D operations, such as rendering three-dimensional images and scenes using processing functions that act upon 3D primitive shapes (e.g., rectangle, triangle, etc.). The 3D pipeline 312 includes programmable and fixed function elements that perform various tasks within the element and/or spawn execution threads to a 3D/Media sub-system 315. While 3D pipeline 312 can be used to perform media operations, an embodiment of GPE 310 also includes a media pipeline 316 that is specifically used to perform media operations, such as video post-processing and image enhancement.

In some embodiments, media pipeline 316 includes fixed function or programmable logic units to perform one or more specialized media operations, such as video decode acceleration, video de-interlacing, and video encode acceleration in place of, or on behalf of video codec engine 306. In some embodiments, media pipeline 316 additionally includes a thread spawning unit to spawn threads for execution on 3D/Media sub-system 315. The spawned threads perform computations for the media operations on one or more graphics execution units included in 3D/Media sub-system 315.

In some embodiments, 3D/Media subsystem 315 includes logic for executing threads spawned by 3D pipeline 312 and media pipeline 316. In one embodiment, the pipelines send thread execution requests to 3D/Media subsystem 315, which includes thread dispatch logic for arbitrating and dispatching the various requests to available thread execution resources. The execution resources include an array of graphics execution units to process the 3D and media threads. In some embodiments, 3D/Media subsystem 315 includes one or more internal caches for thread instructions and data. In some embodiments, the subsystem also includes shared memory, including registers and addressable memory, to share data between threads and to store output data.

3D/Media Processing

Figure 4:
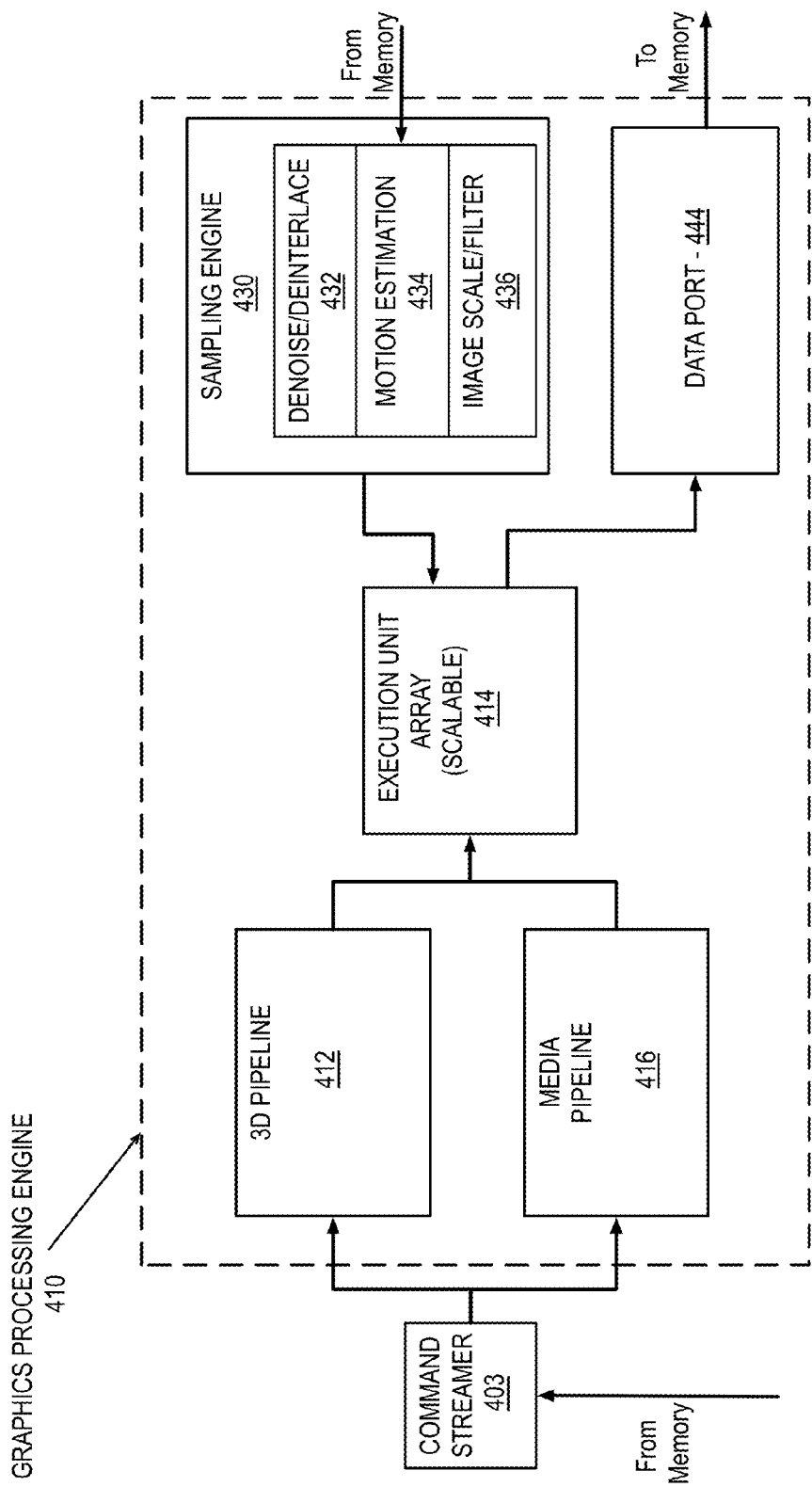
FIG. 4 is a block diagram of an embodiment of a graphics-processing engine for a graphics processor.

FIG. 4 is a block diagram of a graphics processing engine 410 of a graphics processor in accordance with some embodiments. In one embodiment, the GPE 410 is a version of the GPE 310 shown in FIG. 3. Elements of FIG. 4 having the same reference numbers (or names) as the elements of any other figure herein can operate or function in any manner similar to that described elsewhere herein, but are not limited to such.

In some embodiments, GPE 410 couples with a command streamer 403, which provides a command stream to the GPE 3D and media pipelines 412, 416. In some embodiments, command streamer 403 is coupled to memory, which can be system memory, or one or more of internal cache memory and shared cache memory. In some embodiments, command streamer 403 receives commands from the memory and sends the commands to 3D pipeline 412 and/or media pipeline 416. The 3D and media pipelines process the commands by performing operations via logic within the respective pipelines or by dispatching one or more execution threads to an execution unit array 414. In some embodiments, execution unit array 414 is scalable, such that the array includes a variable number of execution units based on the target power and performance level of GPE 410.

In some embodiments, a sampling engine 430 couples with memory (e.g., cache memory or system memory) and execution unit array 414. In some embodiments, sampling engine 430 provides a memory access mechanism for execution unit array 414 that allows execution array 414 to read graphics and media data from memory. In some embodiments, sampling engine 430 includes logic to perform specialized image sampling operations for media.

In some embodiments, the specialized media sampling logic in sampling engine 430 includes a de-noise/de-interlace module 432, a motion estimation module 434, and an image scaling and filtering module 436. In some embodiments, de-noise/de-interlace module 432 includes logic to perform one or more of a de-noise or a de-interlace algorithm on decoded video data. The de-interlace logic combines alternating fields of interlaced video content into a single fame of video. The de-noise logic reduces or removes data noise from video and image data. In some embodiments, the de-noise logic and de-interlace logic are motion adaptive and use spatial or temporal filtering based on the amount of motion detected in the video data. In some embodiments, the de-noise/de-interlace module 432 includes dedicated motion detection logic (e.g., within the motion estimation engine 434).

In some embodiments, motion estimation engine 434 provides hardware acceleration for video operations by performing video acceleration functions such as motion vector estimation and prediction on video data. The motion estimation engine determines motion vectors that describe the transformation of image data between successive video frames. In some embodiments, a graphics processor media codec uses video motion estimation engine 434 to perform operations on video at the macro-block level that may otherwise be too computationally intensive to perform with a general-purpose processor. In some embodiments, motion estimation engine 434 is generally available to graphics processor components to assist with video decode and processing functions that are sensitive or adaptive to the direction or magnitude of the motion within video data.

In some embodiments, image scaling and filtering module 436 performs image-processing operations to enhance the visual quality of generated images and video. In some embodiments, scaling and filtering module 436 processes image and video data during the sampling operation before providing the data to execution unit array 414.

In some embodiments, the GPE 410 includes a data port 444, which provides an additional mechanism for graphics subsystems to access memory. In some embodiments, data port 444 facilitates memory access for operations including render target writes, constant buffer reads, scratch memory space reads/writes, and media surface accesses. In some embodiments, data port 444 includes cache memory space to cache accesses to memory. The cache memory can be a single data cache or separated into multiple caches for the multiple subsystems that access memory via the data port (e.g., a render buffer cache, a constant buffer cache, etc.). In some embodiments, threads executing on an execution unit in execution unit array 414 communicate with the data port by exchanging messages via a data distribution interconnect that couples each of the sub-systems of GPE 410.

Execution Units

Figure 5:
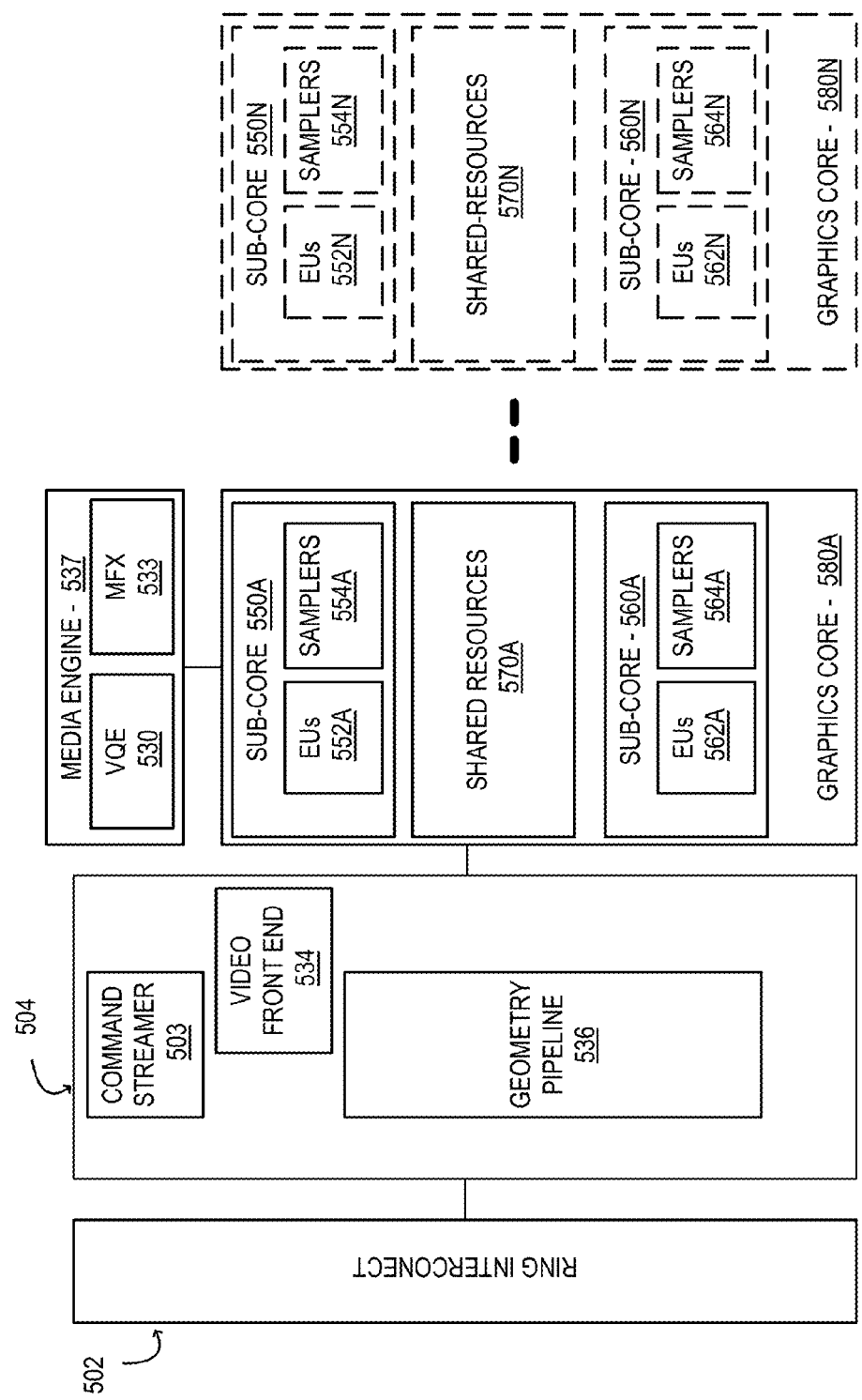
FIG. 5 is a block diagram of another embodiment of a graphics processor.

FIG. 5 is a block diagram of another embodiment of a graphics processor 500. Elements of FIG. 5 having the same reference numbers (or names) as the elements of any other figure herein can operate or function in any manner similar to that described elsewhere herein, but are not limited to such.

In some embodiments, graphics processor 500 includes a ring interconnect 502, a pipeline front-end 504, a media engine 537, and graphics cores 580A-N. In some embodiments, ring interconnect 502 couples the graphics processor to other processing units, including other graphics processors or one or more general-purpose processor cores. In some embodiments, the graphics processor is one of many processors integrated within a multi-core processing system.

In some embodiments, graphics processor 500 receives batches of commands via ring interconnect 502. The incoming commands are interpreted by a command streamer 503 in the pipeline front-end 504. In some embodiments, graphics processor 500 includes scalable execution logic to perform 3D geometry processing and media processing via the graphics core(s) 580A-N. For 3D geometry processing commands, command streamer 503 supplies commands to geometry pipeline 536. For at least some media processing commands, command streamer 503 supplies the commands to a video front end 534, which couples with a media engine 537. In some embodiments, media engine 537 includes a Video Quality Engine (VQE) 530 for video and image post-processing and a multi-format encode/decode (MFX) 533 engine to provide hardware-accelerated media data encode and decode. In some embodiments, geometry pipeline 536 and media engine 537 each generate execution threads for the thread execution resources provided by at least one graphics core 580A.

In some embodiments, graphics processor 500 includes scalable thread execution resources featuring modular cores 580A-N (sometimes referred to as core slices), each having multiple sub-cores 550A-N, 560A-N (sometimes referred to as core sub-slices). In some embodiments, graphics processor 500 can have any number of graphics cores 580A through 580N. In some embodiments, graphics processor 500 includes a graphics core 580A having at least a first sub-core 550A and a second core sub-core 560A. In other embodiments, the graphics processor is a low power processor with a single sub-core (e.g., 550A). In some embodiments, graphics processor 500 includes multiple graphics cores 580A-N, each including a set of first sub-cores 550A-N and a set of second sub-cores 560A-N. Each sub-core in the set of first sub-cores 550A-N includes at least a first set of execution units 552A-N and media/texture samplers 554A-N. Each sub-core in the set of second sub-cores 560A-N includes at least a second set of execution units 562A-N and samplers 564A-N. In some embodiments, each sub-core 550A-N, 560A-N shares a set of shared resources 570A-N. In some embodiments, the shared resources include shared cache memory and pixel operation logic. Other shared resources may also be included in the various embodiments of the graphics processor.

Figure 6:
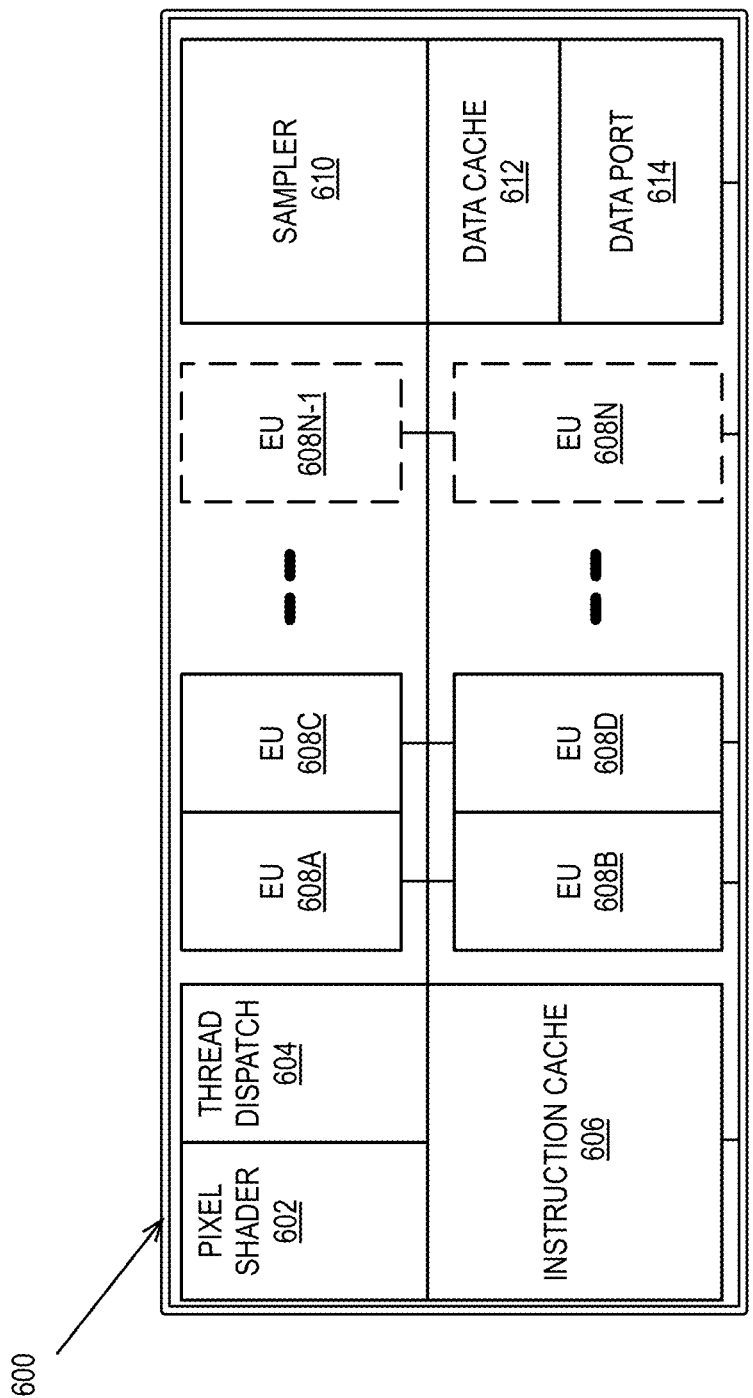
FIG. 6 is a block diagram of thread execution logic including an array of processing elements.

FIG. 6 illustrates thread execution logic 600 including an array of processing elements employed in some embodiments of a GPE. Elements of FIG. 6 having the same reference numbers (or names) as the elements of any other figure herein can operate or function in any manner similar to that described elsewhere herein, but are not limited to such.

In some embodiments, thread execution logic 600 includes a pixel shader 602, a thread dispatcher 604, instruction cache 606, a scalable execution unit array including a plurality of execution units 608A-N, a sampler 610, a data cache 612, and a data port 614. In one embodiment the included components are interconnected via an interconnect fabric that links to each of the components. In some embodiments, thread execution logic 600 includes one or more connections to memory, such as system memory or cache memory, through one or more of instruction cache 606, data port 614, sampler 610, and execution unit array 608A-N. In some embodiments, each execution unit (e.g. 608A) is an individual vector processor capable of executing multiple simultaneous threads and processing multiple data elements in parallel for each thread. In some embodiments, execution unit array 608A-N includes any number individual execution units.

In some embodiments, execution unit array 608A-N is primarily used to execute "shader" programs. In some embodiments, the execution units in array 608A-N execute an instruction set that includes native support for many standard 3D graphics shader instructions, such that shader programs from graphics libraries (e.g., Direct 3D and OpenGL) are executed with a minimal translation. The execution units support vertex and geometry processing (e.g., vertex programs, geometry programs, vertex shaders), pixel processing (e.g., pixel shaders, fragment shaders) and general-purpose processing (e.g., compute and media shaders).

Each execution unit in execution unit array 608A-N operates on arrays of data elements. The number of data elements is the "execution size," or the number of channels for the instruction. An execution channel is a logical unit of execution for data element access, masking, and flow control within instructions. The number of channels may be independent of the number of physical Arithmetic Logic Units (ALUs) or Floating Point Units (FPUs) for a particular graphics processor. In some embodiments, execution units 608A-N support integer and floating-point data types.

The execution unit instruction set includes single instruction multiple data (SIMD) instructions. The various data elements can be stored as a packed data type in a register and the execution unit will process the various elements based on the data size of the elements. For example, when operating on a 256-bit wide vector, the 256 bits of the vector are stored in a register and the execution unit operates on the vector as four separate 64-bit packed data elements (Quad-Word (QW) size data elements), eight separate 32-bit packed data elements (Double Word (DW) size data elements), sixteen separate 16-bit packed data elements (Word (W) size data elements), or thirty-two separate 8-bit data elements (byte (B) size data elements). However, different vector widths and register sizes are possible.

One or more internal instruction caches (e.g., 606) are included in the thread execution logic 600 to cache thread instructions for the execution units. In some embodiments, one or more data caches (e.g., 612) are included to cache thread data during thread execution. In some embodiments, sampler 610 is included to provide texture sampling for 3D operations and media sampling for media operations. In some embodiments, sampler 610 includes specialized texture or media sampling functionality to process texture or media data during the sampling process before providing the sampled data to an execution unit.

During execution, the graphics and media pipelines send thread initiation requests to thread execution logic 600 via thread spawning and dispatch logic. In some embodiments, thread execution logic 600 includes a local thread dispatcher 604 that arbitrates thread initiation requests from the graphics and media pipelines and instantiates the requested threads on one or more execution units 608A-N. For example, the geometry pipeline (e.g., 536 of FIG. 5) dispatches vertex processing, tessellation, or geometry processing threads to thread execution logic 600 (FIG. 6). In some embodiments, thread dispatcher 604 can also process runtime thread spawning requests from the executing shader programs.

Once a group of geometric objects has been processed and rasterized into pixel data, pixel shader 602 is invoked to further compute output information and cause results to be written to output surfaces (e.g., color buffers, depth buffers, stencil buffers, etc.). In some embodiments, pixel shader 602 calculates the values of the various vertex attributes that are to be interpolated across the rasterized object. In some embodiments, pixel shader 602 then executes an API-supplied pixel shader program. To execute the pixel shader program, pixel shader 602 dispatches threads to an execution unit (e.g., 608A) via thread dispatcher 604. In some embodiments, pixel shader 602 uses texture sampling logic in sampler 610 to access texture data in texture maps stored in memory. Arithmetic operations on the texture data and the input geometry data compute pixel color data for each geometric fragment, or discards one or more pixels from further processing.

In some embodiments, the data port 614 provides a memory access mechanism for the thread execution logic 600 output processed data to memory for processing on a graphics processor output pipeline. In some embodiments, the data port 614 includes or couples to one or more cache memories (e.g., data cache 612) to cache data for memory access via the data port.

Figure 7:
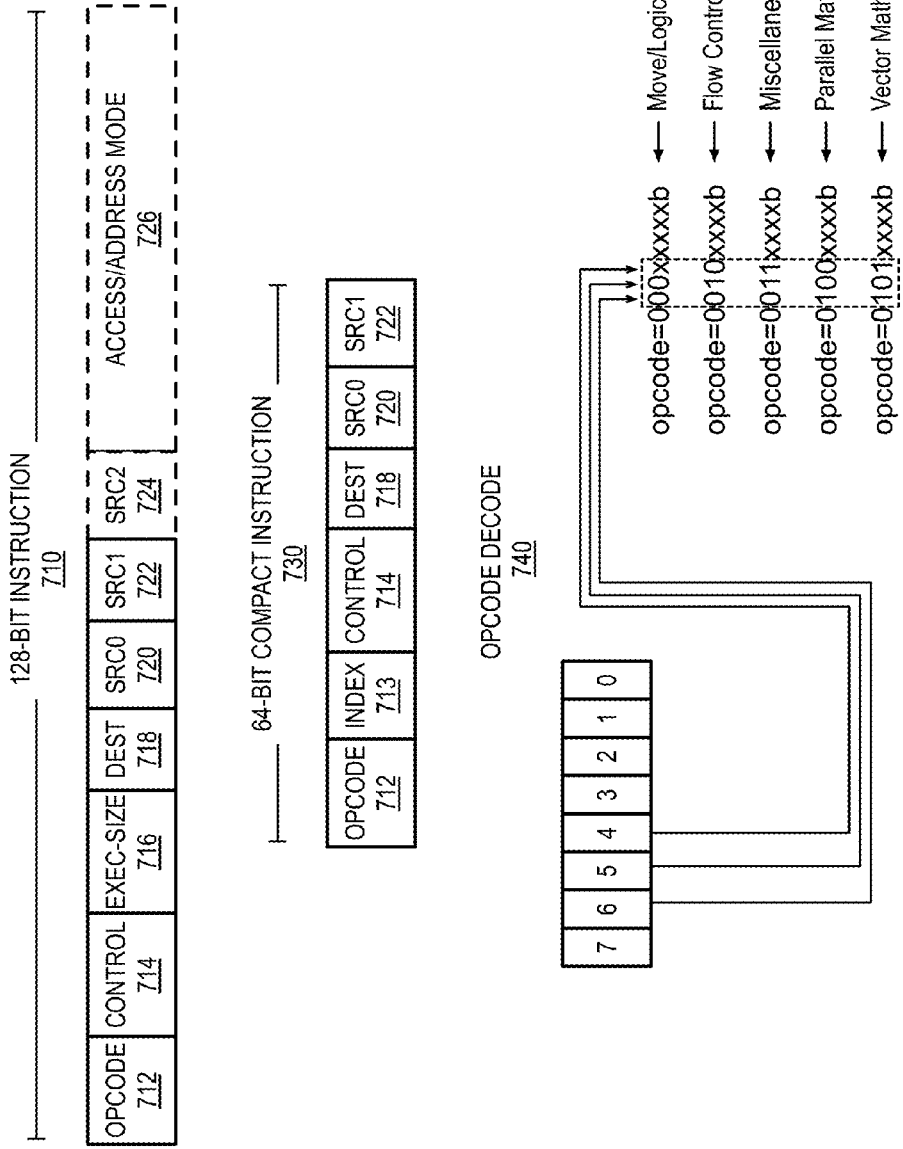
FIG. 7 illustrates a graphics processor execution unit instruction format according to an embodiment.

FIG. 7 is a block diagram illustrating a graphics processor instruction formats 700 according to some embodiments. In one or more embodiment, the graphics processor execution units support an instruction set having instructions in multiple formats. The solid lined boxes illustrate the components that are generally included in an execution unit instruction, while the dashed lines include components that are optional or that are only included in a sub-set of the instructions. In some embodiments, instruction format 700 described and illustrated are macro-instructions, in that they are instructions supplied to the execution unit, as opposed to micro-operations resulting from instruction decode once the instruction is processed.

In some embodiments, the graphics processor execution units natively support instructions in a 128-bit format 710. A 64-bit compacted instruction format 730 is available for some instructions based on the selected instruction, instruction options, and number of operands. The native 128-bit format 710 provides access to all instruction options, while some options and operations are restricted in the 64-bit format 730. The native instructions available in the 64-bit format 730 vary by embodiment. In some embodiments, the instruction is compacted in part using a set of index values in an index field 713. The execution unit hardware references a set of compaction tables based on the index values and uses the compaction table outputs to reconstruct a native instruction in the 128-bit format 710.

For each format, instruction opcode 712 defines the operation that the execution unit is to perform. The execution units execute each instruction in parallel across the multiple data elements of each operand. For example, in response to an add instruction the execution unit performs a simultaneous add operation across each color channel representing a texture element or picture element. By default, the execution unit performs each instruction across all data channels of the operands. In some embodiments, instruction control field 712 enables control over certain execution options, such as channels selection (e.g., predication) and data channel order (e.g., swizzle). For 128-bit instructions 710 an exec-size field 716 limits the number of data channels that will be executed in parallel. In some embodiments, exec-size field 716 is not available for use in the 64-bit compact instruction format 730.

Some execution unit instructions have up to three operands including two source operands, src0 722, src1 722, and one destination 718. In some embodiments, the execution units support dual destination instructions, where one of the destinations is implied. Data manipulation instructions can have a third source operand (e.g., SRC2 724), where the instruction opcode 712 determines the number of source operands. An instruction's last source operand can be an immediate (e.g., hard-coded) value passed with the instruction.

In some embodiments, the 128-bit instruction format 710 includes access/address mode information 726 specifying, for example, whether direct register addressing mode or indirect register addressing mode is used. When direct register addressing mode is used, the register address of one or more operands is directly provided by bits in the instruction 710. When indirect register addressing mode is used, the register address of one or more operands may be computed based on field 726, which specifies an address register value mode and/or an address immediate field in the instruction. In one embodiment the access/address mode information 726 may determine the operand mode to define a data access alignment for the instruction. For example, when in a first mode, the instruction 710 may use byte-aligned addressing for source and destination operands and, when in a second mode, the instruction 710 may use 16-byte-aligned access mode and 1-byte aligned addressing for all source and destination operands. access mode, where the byte alignment of the access mode determines the access alignment of the instruction operands.

In some embodiments instructions are grouped based on opcode bit-fields to simplify Opcode decode 740. For an 8-bit opcode, bits 4, 5, and 6 allow the execution unit to determine the type of opcode. The precise opcode grouping shown is merely an example. In some embodiments, a move and logic opcode group 742 includes data movement and logic instructions (e.g., move (mov), compare (cmp)). In some embodiments, move and logic group 742 shares the five most significant bits (MSB), where move (mov) instructions are in the form of 0000xxxxb (e.g., 0x0x) and logic instructions are in the form of 0001xxxxb (e.g., 0x01). A flow control instruction group 744 (e.g., call, jump (jmp)) includes instructions in the form of 0010xxxxb (e.g., 0x20). A miscellaneous instruction group 746 includes a mix of instructions, including synchronization instructions (e.g., wait, send) in the form of 0011xxxxb (e.g., 0x30). A parallel math instruction group 748 includes component-wise arithmetic instructions (e.g., add, multiply (mul)) in the form of 0100xxxxb (e.g., 0x40). The parallel math group 748 performs the arithmetic operations in parallel across data channels. The vector math group 750 includes arithmetic instructions (e.g., dp4) in the form of 0101xxxxb (e.g., 0x50). The vector math group performs arithmetic such as dot product calculations on vector operands.

Graphics Pipeline

Figure 8:
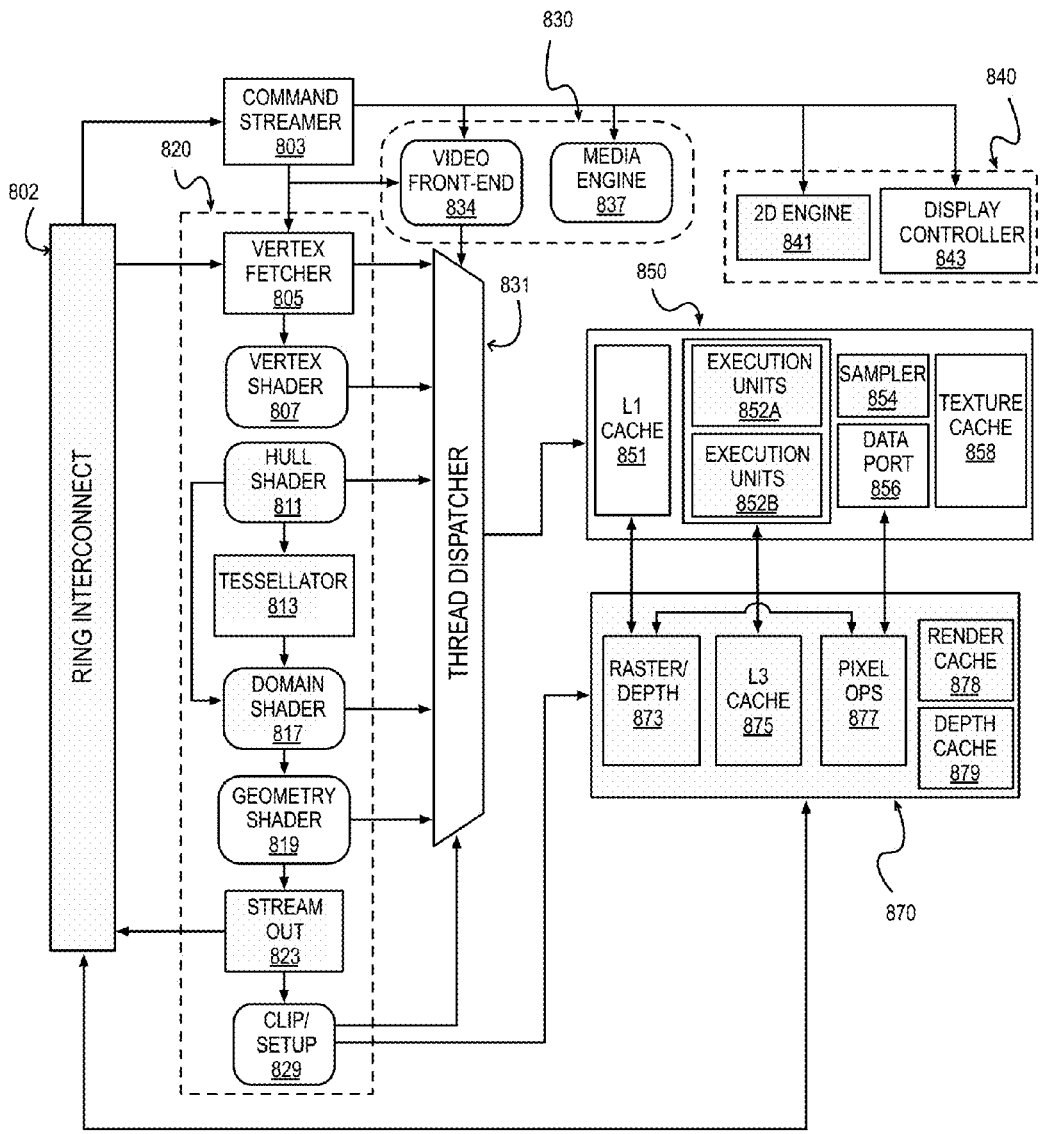
FIG. 8 is a block diagram of another embodiment of a graphics processor which includes a graphics pipeline, a media pipeline, a display engine, thread execution logic, and a render output pipeline.

FIG. 8 is a block diagram of another embodiment of a graphics processor 800. Elements of FIG. 8 having the same reference numbers (or names) as the elements of any other figure herein can operate or function in any manner similar to that described elsewhere herein, but are not limited to such.

In some embodiments, graphics processor 800 includes a graphics pipeline 820, a media pipeline 830, a display engine 840, thread execution logic 850, and a render output pipeline 870. In some embodiments, graphics processor 800 is a graphics processor within a multi-core processing system that includes one or more general purpose processing cores. The graphics processor is controlled by register writes to one or more control registers (not shown) or via commands issued to graphics processor 800 via a ring interconnect 802. In some embodiments, ring interconnect 802 couples graphics processor 800 to other processing components, such as other graphics processors or general-purpose processors. Commands from ring interconnect 802 are interpreted by a command streamer 803, which supplies instructions to individual components of graphics pipeline 820 or media pipeline 830.

In some embodiments, command streamer 803 directs the operation of a vertex fetcher 805 that reads vertex data from memory and executes vertex-processing commands provided by command streamer 803. In some embodiments, vertex fetcher 805 provides vertex data to a vertex shader 807, which performs coordinate space transformation and lighting operations to each vertex. In some embodiments, vertex fetcher 805 and vertex shader 807 execute vertex-processing instructions by dispatching execution threads to execution units 852A, 852B via a thread dispatcher 831.

In some embodiments, execution units 852A, 852B are an array of vector processors having an instruction set for performing graphics and media operations. In some embodiments, execution units 852A, 852B have an attached L1 cache 851 that is specific for each array or shared between the arrays. The cache can be configured as a data cache, an instruction cache, or a single cache that is partitioned to contain data and instructions in different partitions.

In some embodiments, graphics pipeline 820 includes tessellation components to perform hardware-accelerated tessellation of 3D objects. In some embodiments, a programmable hull shader 811 configures the tessellation operations. A programmable domain shader 817 provides back-end evaluation of tessellation output. A tessellator 813 operates at the direction of hull shader 811 and contains special purpose logic to generate a set of detailed geometric objects based on a coarse geometric model that is provided as input to graphics pipeline 820. In some embodiments, if tessellation is not used, tessellation components 811, 813, 817 can be bypassed.

In some embodiments, complete geometric objects can be processed by a geometry shader 819 via one or more threads dispatched to execution units 852A, 852B, or can proceed directly to the clipper 829. In some embodiments, the geometry shader operates on entire geometric objects, rather than vertices or patches of vertices as in previous stages of the graphics pipeline. If the tessellation is disabled the geometry shader 819 receives input from the vertex shader 807. In some embodiments, geometry shader 819 is programmable by a geometry shader program to perform geometry tessellation if the tessellation units are disabled.

Before rasterization, a clipper 829 processes vertex data. The clipper 829 may be a fixed function clipper or a programmable clipper having clipping and geometry shader functions. In some embodiments, a rasterizer 873 in the render output pipeline 870 dispatches pixel shaders to convert the geometric objects into their per pixel representations. In some embodiments, pixel shader logic is included in thread execution logic 850. In some embodiments, an application can bypass the rasterizer 873 and access un-rasterized vertex data via a stream out unit 823.

The graphics processor 800 has an interconnect bus, interconnect fabric, or some other interconnect mechanism that allows data and message passing amongst the major components of the processor. In some embodiments, execution units 852A, 852B and associated cache(s) 851, texture and media sampler 854, and texture/sampler cache 858 interconnect via a data port 856 to perform memory access and communicate with render output pipeline components of the processor. In some embodiments, sampler 854, caches 851, 858 and execution units 852A, 852B each have separate memory access paths.

In some embodiments, render output pipeline 870 contains a rasterizer and depth test component 873 that converts vertex-based objects into an associated pixel-based representation. In some embodiments, the rasterizer logic includes a windower/masker unit to perform fixed function triangle and line rasterization. Associated render and depth buffer caches 878, 879 are also available in some embodiments. A pixel operations component 877 performs pixel-based operations on the data, though in some instances, pixel operations associated with 2D operations (e.g. bit block image transfers with blending) are performed by the 2D engine 841, or substituted at display time by the display controller 843 using overlay display planes. In some embodiments, a shared L3 cache 875 is available to all graphics components, allowing the sharing of data without the use of main system memory.

In some embodiments, graphics processor media pipeline 830 includes a media engine 837 and a video front end 834. In some embodiments, video front end 834 receives pipeline commands from the command streamer 803. In some embodiments, media pipeline 830 includes a separate command streamer. In some embodiments, video front-end 834 processes media commands before sending the command to the media engine 837. In some embodiments, media engine 337 includes thread spawning functionality to spawn threads for dispatch to thread execution logic 850 via thread dispatcher 831.

In some embodiments, graphics processor 800 includes a display engine 840. In some embodiments, display engine 840 is external to processor 800 and couples with the graphics processor via the ring interconnect 802, or some other interconnect bus or fabric. In some embodiments, display engine 840 includes a 2D engine 841 and a display controller 843. In some embodiments, display engine 840 contains special purpose logic capable of operating independently of the 3D pipeline. In some embodiments, display controller 843 couples with a display device (not shown), which may be a system integrated display device, as in a laptop computer, or an external display device attached via a display device connector.

In some embodiments, graphics pipeline 820 and media pipeline 830 are configurable to perform operations based on multiple graphics and media programming interfaces and are not specific to any one application programming interface (API). In some embodiments, driver software for the graphics processor translates API calls that are specific to a particular graphics or media library into commands that can be processed by the graphics processor. In some embodiments, support is provided for the Open Graphics Library (OpenGL) and Open Computing Language (OpenCL) from the Khronos Group, the Direct3D library from the Microsoft Corporation, or support may be provided to both OpenGL and D3D. Support may also be provided for the Open Source Computer Vision Library (OpenCV). A future API with a compatible 3D pipeline would also be supported if a mapping can be made from the pipeline of the future API to the pipeline of the graphics processor.

Graphics Pipeline Programming

FIG. 9A is a block diagram illustrating a graphics processor command format 900 according to some embodiments. FIG. 9B is a block diagram illustrating a graphics processor command sequence 910 according to an embodiment. The solid lined boxes in FIG. 9A illustrate the components that are generally included in a graphics command while the dashed lines include components that are optional or that are only included in a sub-set of the graphics commands. The exemplary graphics processor command format 900 of FIG. 9A includes data fields to identify a target client 902 of the command, a command operation code (opcode) 904, and the relevant data 906 for the command. A sub-opcode 905 and a command size 908 are also included in some commands.

In some embodiments, client 902 specifies the client unit of the graphics device that processes the command data. In some embodiments, a graphics processor command parser examines the client field of each command to condition the further processing of the command and route the command data to the appropriate client unit. In some embodiments, the graphics processor client units include a memory interface unit, a render unit, a 2D unit, a 3D unit, and a media unit. Each client unit has a corresponding processing pipeline that processes the commands. Once the command is received by the client unit, the client unit reads the opcode 904 and, if present, sub-opcode 905 to determine the operation to perform. The client unit performs the command using information in data field 906. For some commands an explicit command size 908 is expected to specify the size of the command. In some embodiments, the command parser automatically determines the size of at least some of the commands based on the command opcode. In some embodiments commands are aligned via multiples of a double word.

The flow diagram in FIG. 9B shows an exemplary command sequence 910. In some embodiments, software or firmware of a data processing system that features an embodiment of a graphics processor uses a version of the command sequence shown to set up, execute, and terminate a set of graphics operations. A sample command sequence is shown and described for purposes of example only as embodiments are not limited to these specific commands or to this command sequence. Moreover, the commands may be issued as batch of commands in a command sequence, such that the graphics processor will process the sequence of commands in at least partially concurrence.

In some embodiments, sample command sequence 910 may begin with a pipeline flush command 912 to cause any active graphics pipeline to complete the currently pending commands for the pipeline. In some embodiments, the 3D pipeline 922 and the media pipeline 924 do not operate concurrently. The pipeline flush is performed to cause the active graphics pipeline to complete any pending commands. In response to a pipeline flush, the command parser for the graphics processor will pause command processing until the active drawing engines complete pending operations and the relevant read caches are invalidated. Optionally, any data in the render cache that is marked 'dirty' can be flushed to memory. In some embodiments, pipeline flush command 912 can be used for pipeline synchronization or before placing the graphics processor into a low power state.

In some embodiments, a pipeline select command 913 is used when a command sequence requires the graphics processor to explicitly switch between pipelines. In some embodiments, a pipeline select command 913 is required only once within an execution context before issuing pipeline commands unless the context is to issue commands for both pipelines. In some embodiments, a pipeline flush command is 912 is required immediately before a pipeline switch via the pipeline select command 913.

In some embodiments, a pipeline control command 914 configures a graphics pipeline for operation and is used to program the 3D pipeline 922 and the media pipeline 924. In some embodiments, pipeline control command 914 configures the pipeline state for the active pipeline. In one embodiment, the pipeline control command 914 is used for pipeline synchronization and to clear data from one or more cache memories within the active pipeline before processing a batch of commands.

In some embodiments, return buffer state commands 916 are used to configure a set of return buffers for the respective pipelines to write data. Some pipeline operations require the allocation, selection, or configuration of one or more return buffers into which the operations write intermediate data during processing. In some embodiments, the graphics processor also uses one or more return buffers to store output data and to perform cross thread communication. In some embodiments, the return buffer state 916 includes selecting the size and number of return buffers to use for a set of pipeline operations.

The remaining commands in the command sequence differ based on the active pipeline for operations. Based on a pipeline determination 920, the command sequence is tailored to the 3D pipeline 922 beginning with the 3D pipeline state 930, or the media pipeline 924 beginning at the media pipeline state 940.

The commands for the 3D pipeline state 930 include 3D state setting commands for vertex buffer state, vertex element state, constant color state, depth buffer state, and other state variables that are to be configured before 3D primitive commands are processed. The values of these commands are determined at least in part based the particular 3D API in use. In some embodiments, 3D pipeline state 930 commands are also able to selectively disable or bypass certain pipeline elements if those elements will not be used.

In some embodiments, 3D primitive 932 command is used to submit 3D primitives to be processed by the 3D pipeline. Commands and associated parameters that are passed to the graphics processor via the 3D primitive 932 command are forwarded to the vertex fetch function in the graphics pipeline. The vertex fetch function uses the 3D primitive 932 command data to generate vertex data structures. The vertex data structures are stored in one or more return buffers. In some embodiments, 3D primitive 932 command is used to perform vertex operations on 3D primitives via vertex shaders. To process vertex shaders, 3D pipeline 922 dispatches shader execution threads to graphics processor execution units.

In some embodiments, 3D pipeline 922 is triggered via an execute 934 command or event. In some embodiments, a register write triggers command execution. In some embodiments execution is triggered via a 'go' or 'kick' command in the command sequence. In one embodiment command execution is triggered using a pipeline synchronization command to flush the command sequence through the graphics pipeline. The 3D pipeline will perform geometry processing for the 3D primitives. Once operations are complete, the resulting geometric objects are rasterized and the pixel engine colors the resulting pixels. Additional commands to control pixel shading and pixel back end operations may also be included for those operations.

In some embodiments, sample command sequence 910 follows the media pipeline 924 path when performing media operations. In general, the specific use and manner of programming for the media pipeline 924 depends on the media or compute operations to be performed. Specific media decode operations may be offloaded to the media pipeline during media decode. In some embodiments, the media pipeline can also be bypassed and media decode can be performed in whole or in part using resources provided by one or more general purpose processing cores. In one embodiment, the media pipeline also includes elements for general-purpose graphics processor unit (GPGPU) operations, where the graphics processor is used to perform SIMD vector operations using computational shader programs that are not explicitly related to the rendering of graphics primitives.

In some embodiments, media pipeline 924 is configured in a similar manner as the 3D pipeline 922. A set of media pipeline state commands 940 are dispatched or placed into in a command queue before the media object commands 942. In some embodiments, media pipeline state commands 940 include data to configure the media pipeline elements that will be used to process the media objects. This includes data to configure the video decode and video encode logic within the media pipeline, such as encode or decode format. In some embodiments, media pipeline state commands 940 also support the use one or more pointers to "indirect" state elements that contain a batch of state settings.

In some embodiments, media object commands 942 supply pointers to media objects for processing by the media pipeline. The media objects include memory buffers containing video data to be processed. In some embodiments, all media pipeline states must be valid before issuing a media object command 942. Once the pipeline state is configured and media object commands 942 are queued, the media pipeline 924 is triggered via an execute command 944 or an equivalent execute event (e.g., register write). Output from media pipeline 924 may then be post processed by operations provided by the 3D pipeline 922 or the media pipeline 924. In some embodiments, GPGPU operations are configured and executed in a similar manner as media operations.

Graphics Software Architecture

Figure 10:
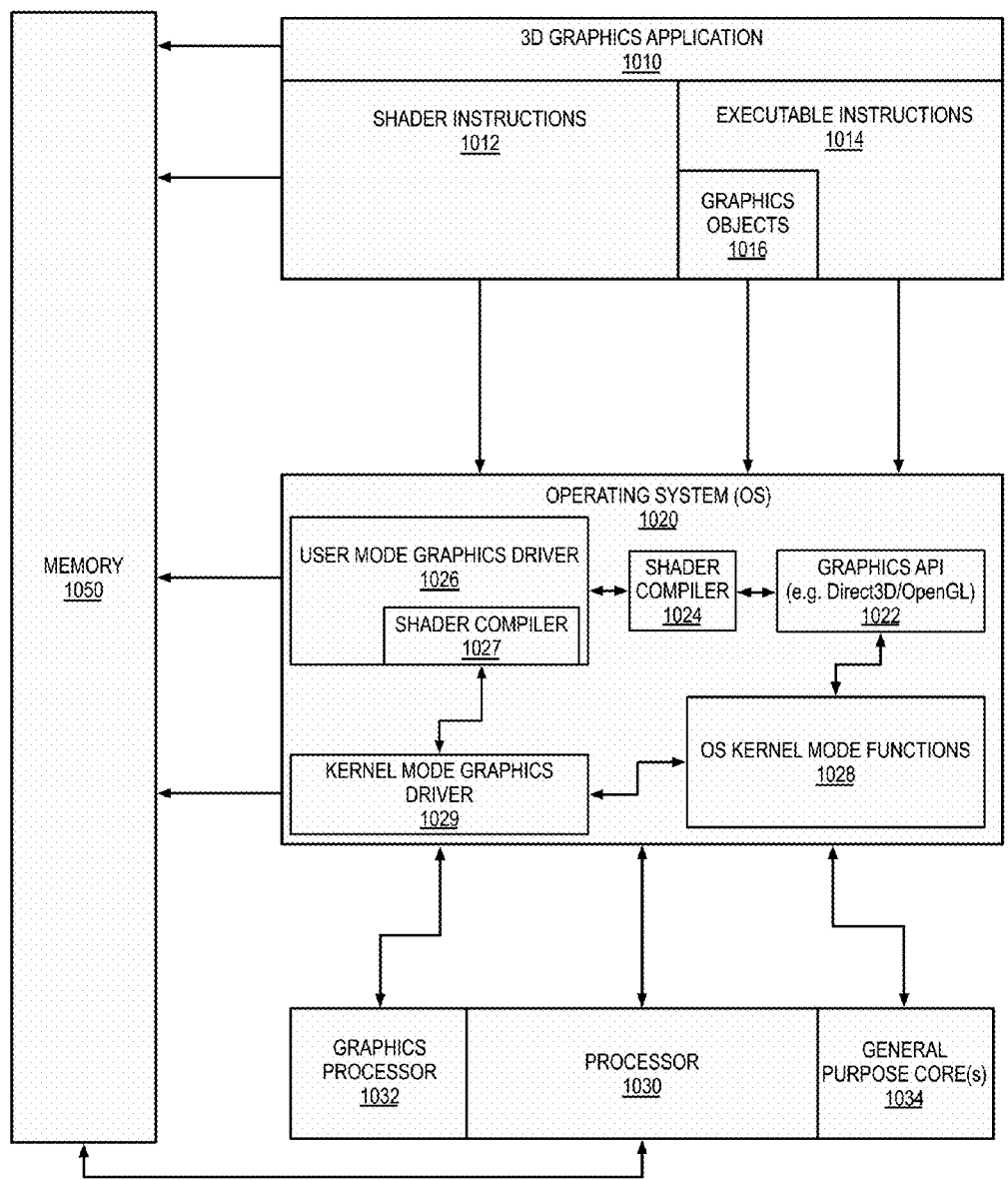
FIG. 10 illustrates exemplary graphics software architecture for a data processing system according to an embodiment.

FIG. 10 illustrates exemplary graphics software architecture 1000 for a data processing system according to some embodiments. In some embodiments, software architecture includes a 3D graphics application 1010, an operating system 1020, and at least one processor 1030. In some embodiments, processor 1030 includes a graphics processor 1032 and one or more general-purpose processor core(s) 1034. The graphics application 1010 and operating system 1020 each execute in the system memory 1050 of the data processing system.

In some embodiments, 3D graphics application 1010 contains one or more shader programs including shader instructions 1012. The shader language instructions may be in a high-level shader language, such as the High Level Shader Language (HLSL) or the OpenGL Shader Language (GLSL). The application also includes executable instructions 1014 in a machine language suitable for execution by the general-purpose processor core 1034. The application also includes graphics objects 1016 defined by vertex data.

In some embodiments, operating system 1020 is a Microsoft® Windows® operating system from the Microsoft Corporation, a proprietary UNIX-like operating system, or an open source UNIX-like operating system using a variant of the Linux kernel. When the Direct3D API is in use, the operating system 1020 uses a front-end shader compiler 1024 to compile any shader instructions 1012 in HLSL into a lower-level shader language. The compilation may be a just-in-time (JIT) compilation or the application can perform shader pre-compilation. In some embodiments, high-level shaders are compiled into low-level shaders during the compilation of the 3D graphics application 1010.

In some embodiments, user mode graphics driver 1026 contains a back-end shader compiler 1027 to convert the shader instructions 1012 into a hardware specific representation. When the OpenGL API is in use, shader instructions 1012 in the GLSL high-level language are passed to a user mode graphics driver 1026 for compilation. In some embodiments, user mode graphics driver 1026 uses operating system kernel mode functions 1028 to communicate with a kernel mode graphics driver 1029. In some embodiments, kernel mode graphics driver 1029 communicates with graphics processor 1032 to dispatch commands and instructions.

Method and Apparatus for Implementing Power Saving Techniques when Processing Floating Point Values The embodiments of the invention described herein include techniques for low-power operation of register file (RF) and wide buses. In one embodiment, the low-power operation is achieved by employing "1" reduction for return-to-zero (RZ) operations and toggle reduction for non-return-to-zero (NRZ) operation. By utilizing graphics-application-specific data properties, the proposed techniques can achieve considerable power savings of 10-20% for RF and 5-10% for wide buses with negligible hardware overhead.

In graphic workloads, most values are in the Red Green Blue Alpha (RGBA) space where each value is a normalized 32 bit single-precision floating point value ranging from 0 to 1. In the IEEE 754 32 bit floating format, the exponent has a bias of 127. This results in two statistical properties for values used in graphic workloads. First, the five exponent bits at bit 25 to bit 29 of the 32-bit value are highly correlated. If any single bit out of those five bits (bit 25 to bit 29) is one, it is highly likely that the five bits are all 1s. Second, the probability that the five bits are all 1s is very high. By taking advantage of these two properties, the proposed techniques skew bit data polarities and data switching probabilities to the direction such that hardware can perform low power operations. In certain implementations, buses, and memory blocks, operation of 0's and 1's, and different toggles from 0→1 and 1→0 may show skewed power/energy consumption for different cases. Use of the techniques described herein may lower the operation power of system.

Note that while the embodiments of the invention operate with 32 bit values as mentioned above, the underlying principles of the invention may be applied to other types of values including, but not limited to, groups of 16 bit half precision floating point numbers, or groups of 64 bit double precision floating point numbers.

Figure 11:
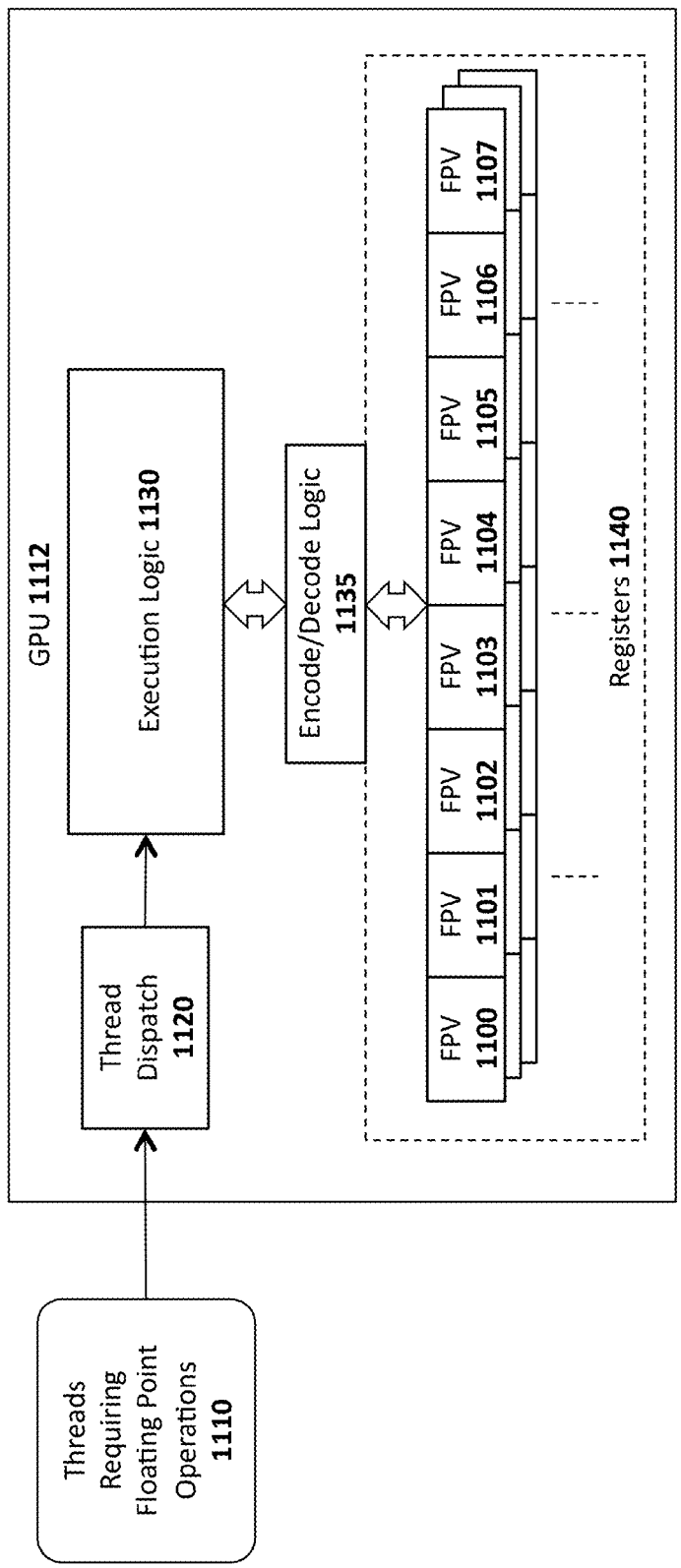
FIG. 11 illustrates one embodiment of an architecture on which embodiments of the invention may be implemented.

As illustrated in FIG. 11, an architecture in which the embodiments of the invention may be implemented include a graphics processing unit 1112 with execution logic 1130 for executing threads requiring floating point operations 1110 which are dispatched to the execution logic 1130 via a thread dispatch unit 1120. While a single instance of execution logic 1130 is shown in FIG. 11 for simplicity, it will be understood that the GPU 1112 may include multiple instances of the execution logic 1130 for concurrently executing program code from multiple threads (e.g., the GPU 600 illustrated in FIG. 6 includes multiple execution units 608A-N). However, the underlying principles of the invention are not limited to any particular graphics processor architecture.

The floating point values in the embodiment in FIG. 11 are stored within a set of registers 1140 which may be a general purpose register file (GRF). In one embodiment, multiple floating point values may be packed within each register of the register file. In the specific example shown in FIG. 11, eight floating point values (FPVs) 1100-1107 are packed within each register. By way of example, each general purpose register may be 256-bits wide and each floating point value may be a 32-bit, single-precision floating point value. Of course, the underlying principles of the invention are not limited to any particular register size or floating point format. Thus, while the remainder of this detailed description will assume a 32-bit floating point format, the underlying principles of the invention may be extended to other formats.

As illustrated in FIG. 11, in one embodiment, the execution logic 1130 utilizes encode/decode logic 1135 to implement the power reduction techniques described herein when writing and reading floating point values to and from the register file 1140, respectively. While the encode/decode logic 1135 is shown as a separate entity in FIG. 11, it may be integrated directly within the execution logic 1130 and/or the register file 1140 while still complying with the underlying principles of the invention.

Figures 12A, 12B:
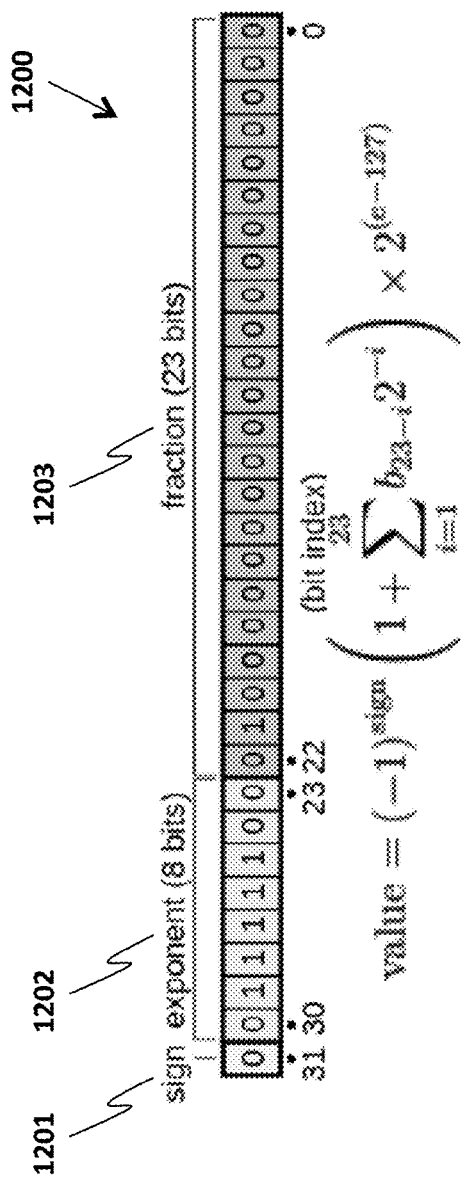
FIG. 12A-B illustrate pertinent characteristics of certain portions of a floating point value.

FIG. 12A show a 32-bit single-precision floating-point format 1200 definition, comprising a 1 bit sign 1201, an 8-bit exponent 1202, and a 23-bit fraction 1203. FIG. 12B shows representation examples for values of 0.125 (row 1), 0.25 (row 2), 0.5 (row 3) and 1 (row 4). For any value between 0.125 and 1, the five bits at bit 25 to bit 29 should be all 1s at the same time by definition. As a result, in graphic systems extensively using data within a range of 0 to 1, the five exponent bits at b25-b29 are highly correlated. If any single bit out of those five bits (b25 to b29) is one, it is highly likely that all those five bits are all 1s. In addition, the probability that the five bits are all 1s is very high.

Figure 13A:
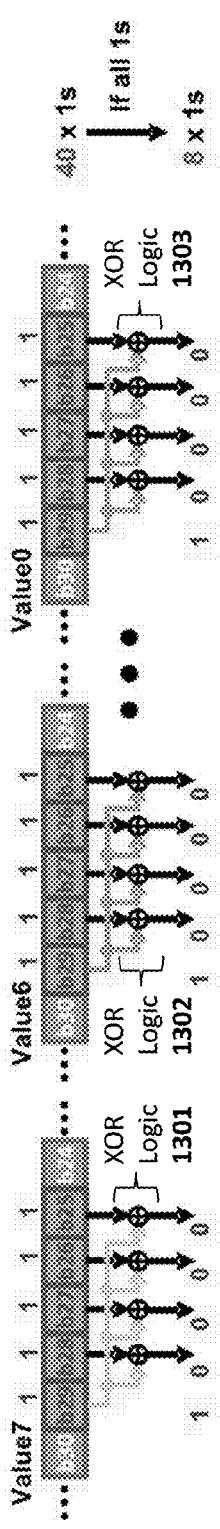
FIGS. 13A-C illustrate encode/decode logic employed in three different embodiments of the invention.
Figure 13B:
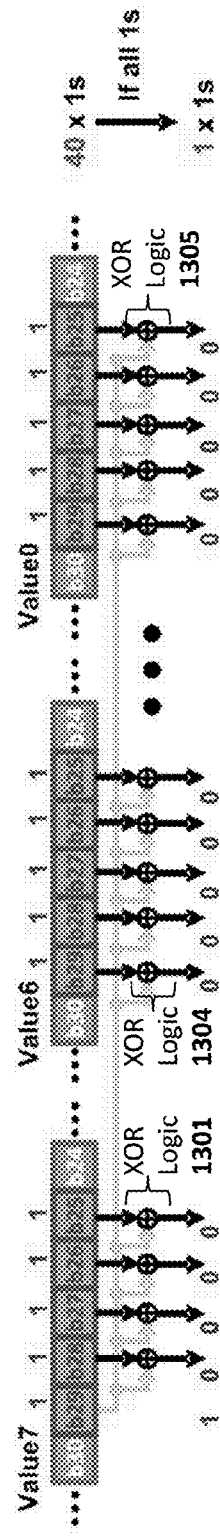
Figure 13C:
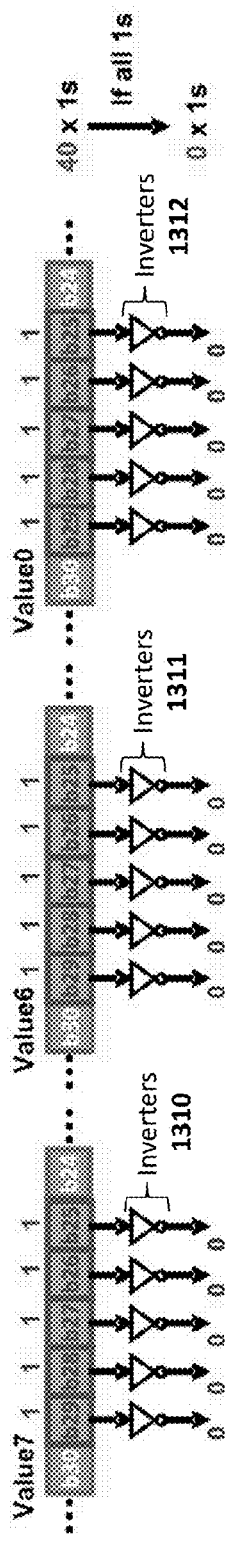

FIGS. 13A-C illustrate one embodiment the encode/decode logic 1135 comprising circuits that take advantage of the aforementioned properties to reduce power consumption. The techniques implemented by the circuits reduce the operation of reading is from the registers 1140 for read power savings. For each technique, the same implementation is used for both encoding (when writing into register file 1140) and decoding data (when reading from the register file 1140).

In FIG. 13A (32-bit-unit XORs), XOR logic 1301-1303 is used to XOR each of four bits (bit28 to bit25) with bit29 in each 32 bit value. Only values 0, 6, and 7 are shown for simplicity. In FIG. 13B, (256 bit-unit XORs), bit29 of Value7 (one 32 bit value out of the 8 values) is used for all XORs across all 8 32 bit values (Value7 to Value0). In this embodiment, five XOR gates are used for Value 6 to Value 0 and four XOR gates are used for Value 7. For example, five XOR gates 1304 are used to XOR bit29 of Value 7 with each of bits 25-29 of Value 6 and five XOR gates 1305 are used to XOR bit29 of Value 7 with each of bits 25-29 of Value 0. The number of XOR gates 1301 for Value7 is four, as illustrated.

While FIGS. 13A and 13B show specific examples with 32 bit numbers, the underlying principles of the invention can, in fact, be applied to any number granularity. For instance, these techniques can be applied to groups of 32 bit single precision floating point numbers, groups of 16 bit half precision floating point numbers, or groups of 64 bit double precision floating point numbers, to name a few.

Since the probability of all bits from b29 to b25 being is in each value is high, simple inversion may also be effective in reducing the count of is in the register file data. FIG. 13C illustrates one embodiment in which a plurality of inverters 1310-1312 invert the outputs of bits 25-29 of each floating point value (only values 0, 6, and 7 are shown for simplicity). The end results is that the is from these bit values are inverted to 0s by the inverters 1310-1312.

Assume that for a 256-bit entry with 8 values of 32-bits each, five bits of bit29 to bit25 in each value are all is as shown in FIGS. 13A-C and the other bits are all 0s. During a register file read operation of the entry, there are 40 operations of reading is since the total count of 1s is 40 (8 values×5 bits). The techniques shown in FIGS. 13A, 13B and 13C reduce the total count of 1s in the entry to 8, 1 and 0, respectively. Consequently, the operation of reading 1s decreases accordingly. The technique shown in FIG. 13B (256 bit-unit XORs) may require more XOR gates and routing resources compared with that of FIG. 13A since bit29 in Value7 is fed to all XORs for all eight values. Note that the XOR-based technique does not increase the count of 1s, even when the input data pattern is uniformly random. The inversion technique in FIG. 13C has almost no overhead in implementation since the inverted signals may be available already, or inversion of the signal can be optimized in the downstream logic easily. The simple inversion may not be beneficial for some cases (e.g., bit29 to bit25 all being 0). However, it can still yield significant power savings on average, because the five bits in graphics workloads is significantly skewed towards all 1s.

While the embodiments described above XOR bit 29 with bits 25-28, other bits may be selected to be XORed with the remaining bit values while complying with the underlying principles of the invention. The reference bit may be any value out of those specified set of bit positions (bit 29-bit 25). For example, any one of bits 25-28 can be XORed with the remaining bits from bits 25-29 to achieve the same result.

Figures 14A, 14B:
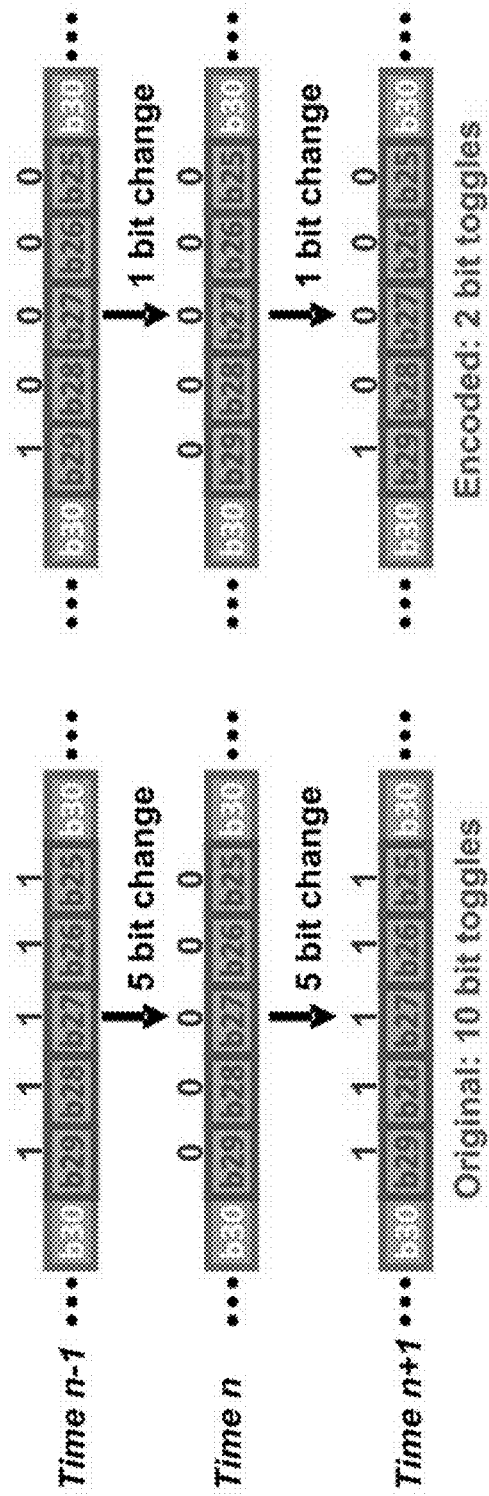
FIG. 14A-B illustrate an example showing that the embodiments of the invention reduce the number of toggles between the previous and current values.

The same techniques shown in FIGS. 13A and 13B also reduce the toggles between the previous and current values. Toggle reduction results in power savings for RF write operation and data movements in long/wide buses. FIGS. 14A-B shows an example in which the number of toggles reduces from 10 (FIG. 14A) to 2 (FIG. 14B) using the XOR-based techniques. In particular, without implementation of the embodiments of the invention, 10 toggles result from time n−1 to time n+1 while using the embodiments of the invention, 2 toggles result during the same time increments. Note that the inverting technique in FIG. 13C does not reduce the number of toggles as do the XOR techniques in FIGS. 13A-B.

In current Intel graphics architectures, there are several buses whose length are in the approximate few thousand micro meter range and the width of each bus is several hundreds. Given these parameters, the embodiments of the invention may be used to reduce power on these bus types.

Figure 15:
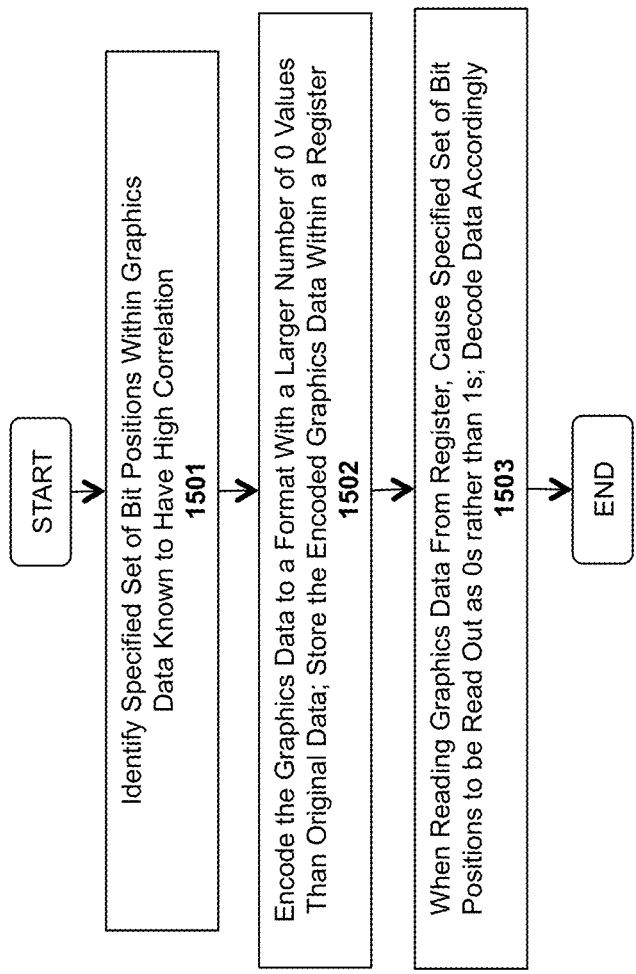
FIG. 15 illustrates a method in accordance with one embodiment of the invention.

FIG. 15 illustrates a method in accordance with one embodiment of the invention. The method may be implemented within the context of the architectures described above, but is not limited to any specific architecture.

At 1501, a specified set of bit positions within graphics data are identified which are known to have a high correlation. The correlation may be based on the type of graphics data being processed. For example, as mentioned above, in graphic workloads, most of the values are in the Red Green Blue Alpha (RGBA) space where each value is a normalized 32 bit single-precision floating point value ranging from 0 to 1 and where the five exponent bits at bit 25 to bit 29 of the 32-bit value are highly correlated (e.g., if any single bit out of those five bits is one, it is highly likely that the five bits are all 1s). In addition, the probability that the five bits are all 1s is very high.

At 1502, the graphics data are encoded using a format with a larger number of 0s than the original data format and the encoded data is stored within a register. As mentioned, in one embodiment, a set of 8 32-bit floating point values may be packed into a single 256-bit register. Of course, the underlying principles of the invention are not limited to any particular floating point format or register size.

At 1503, when reading the graphics data, one embodiment of the invention causes the data from the specified set of bit positions to be read from the register as a set of 0s, rather than a set of 1s, thereby conserving power. As mentioned above, this may be accomplished by XORing the values in the specified set of bit positions and/or by simply inverting the values (see, e.g., FIGS. 13A-C). The data read out if then decoded back to its original format.

One important observation is that there are many RFs and buses storing and moving data in the form of RGBA in graphics processing designs. consequently, the embodiments of the invention described herein have high potential to reduce power consumption in many different parts of graphics cores.

While data bus inversion (DBI) may be used for the same purpose as the embodiments of the invention, DBI techniques have several significant disadvantages compared with the embodiments of the invention. For example, DBI requires significant overhead in terms of the number of bits or wires and is therefore impractical for RFs. For example, 8 bit DBI (currently used in DDR4 and GDDR5) requires one additional bit every 8 bits. If 8 bit DBI is used for 256 bit register files or buses, 32 additional bits or wires are required. In addition, DBI requires a majority voter block typically built in the form of adder trees. The implementation of the voter in hardware incurs significant overhead in terms of power/timing/area. Finally, for DBI alternate current (AC), the previous value needs to be saved in a buffer and compared with the current value. This buffer and comparison logic are overhead in current DBI implementations.

In contrast, the embodiments of the invention described herein have extremely low overhead because they do not require maintaining a history of data and/or a voting mechanism. Thus, no additional bit or signal is required, no majority voter block is required, and no memory buffer or comparison logic is required. At the same time, these embodiments can achieve comparable power savings to DBI techniques by taking advantage of the unique properties of graphic data.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

Embodiments of the invention may include various steps, which have been described above. The steps may be embodied in machine-executable instructions which may be used to cause a general-purpose or special-purpose processor to perform the steps. Alternatively, these steps may be performed by specific hardware components that contain hard-wired logic for performing the steps, or by any combination of programmed computer components and custom hardware components.

As described herein, instructions may refer to specific configurations of hardware such as application specific integrated circuits (ASICs) configured to perform certain operations or having a predetermined functionality or software instructions stored in memory embodied in a non-transitory computer readable medium. Thus, the techniques shown in the Figures can be implemented using code and data stored and executed on one or more electronic devices (e.g., an end station, a network element, etc.). Such electronic devices store and communicate (internally and/or with other electronic devices over a network) code and data using computer machine-readable media, such as non-transitory computer machine-readable storage media (e.g., magnetic disks; optical disks; random access memory; read only memory; flash memory devices; phase-change memory) and transitory computer machine-readable communication media (e.g., electrical, optical, acoustical or other form of propagated signals—such as carrier waves, infrared signals, digital signals, etc.). In addition, such electronic devices typically include a set of one or more processors coupled to one or more other components, such as one or more storage devices (non-transitory machine-readable storage media), user input/output devices (e.g., a keyboard, a touchscreen, and/or a display), and network connections. The coupling of the set of processors and other components is typically through one or more busses and bridges (also termed as bus controllers). The storage device and signals carrying the network traffic respectively represent one or more machine-readable storage media and machine-readable communication media. Thus, the storage device of a given electronic device typically stores code and/or data for execution on the set of one or more processors of that electronic device. Of course, one or more parts of an embodiment of the invention may be implemented using different combinations of software, firmware, and/or hardware. Throughout this detailed description, for the purposes of explanation, numerous specific details were set forth in order to provide a thorough understanding of the present invention. It will be apparent, however, to one skilled in the art that the invention may be practiced without some of these specific details. In certain instances, well known structures and functions were not described in elaborate detail in order to avoid obscuring the subject matter of the present invention. Accordingly, the scope and spirit of the invention should be judged in terms of the claims which follow.

What is claimed is:

1. An apparatus comprising:
a graphics processor unit (GPU) to process graphics data including floating point data;
a set of registers, at least one of the registers of the set partitioned to store the floating point data; and
encode/decode logic to reduce a number of binary 1 values being read from the at least one register, the encode/decode logic comprising a set of exclusive OR (XOR) gates to cause a specified set of bit positions within the floating point data to be read out as 0s rather than 1s, wherein XOR gates are applied by XORing a first bit within the specified set of bit positions for a first floating point value with each additional bit within the specified set of bit positions of the first floating point value.

2. The apparatus as in claim 1 wherein each floating point value comprises a 32-bit single precision floating point value, wherein the specified set of bit positions comprises bits 25 to 29, wherein the first bit comprises bit 29 and wherein each additional bit XORed with bit 29 comprises bits 25 to 28.

3. The apparatus as in claim 2 wherein the first bit within the specified set of bit positions of the first floating point value is also XORed with each bit within the specified set of bit positions with a plurality of other floating point values.

4. The apparatus as in claim 3 wherein the bits of the other floating point values XORed with bit 29 of the first floating point value comprise bits 25 to 29.

5. The apparatus as in claim 1 wherein the specified set of bit positions are selected based on a type of graphics data being processed.

6. The apparatus as in claim 5 wherein the specified set of bit positions are selected based on a determined correlation between the bits within the set of bit positions, the determined correlation indicates a high likelihood of the bits having a same bit value if any one of the bits is of the same bit value.

7. The apparatus as in claim 6 wherein the graphics data comprises Red Green Blue Alpha (RGBA) data.

8. The apparatus as in claim 7 wherein floating point values of the RGBA data comprise normalized 32-bit single-precision floating point values ranging from 0 to 1.

9. The apparatus as in claim 8 wherein the specified set of bit positions known to have a high correlation comprises a specified portion of an exponent of the 32-bit single precision floating point value.

10. The apparatus as in claim 9 wherein the specified set of bit positions comprises bits 25 to 29.

11. A method comprising:
determining a specified set of bit positions of floating point graphics data known to have a high correlation as to indicate a high likelihood of the specified set of bit positions having a same bit value if any one of the set of bit positions is of the same bit value, the specified set of bit positions being a proper subset of all bit positions of the floating point graphics data type;
storing the floating point graphics data within at least one register of a set of registers; and
reducing a number of binary 1 values being read from the at least one register by causing the specified set of bit positions within the floating point data to be read out from the at least one register as 0s rather than 1s.

12. The method as in claim 11 wherein causing the specified set of bit positions within the floating point data to be read out from the at least one register as 0s rather than 1s comprises XORing bits within the specified set of bit positions.

13. The method as in claim 12 further comprising XORing a first bit within the specified set of bit positions for a first floating point value with each additional bit within the specified set of bit positions of the first floating point value.

14. The method as in claim 13 wherein each floating point value comprises a 32-bit single precision floating point value, wherein the specified set of bit positions comprises bits 25 to 29, wherein the first bit comprises bit 29 and wherein each additional bit XORed with bit 29 comprises bits 25 to 28.

15. The method as in claim 12 further comprising XORing a first bit within the specified set of bit positions for a first floating point value with each additional bit within the specified set of bit positions of the first floating point value and wherein the first bit within the specified set of bit positions of the first floating point value is also XORed with each bit within the specified set of bit positions with a plurality of other floating point values.

16. The method as in claim 12 wherein each floating point value comprises a 32-bit single precision floating point value, wherein the specified set of bit positions comprises bits 25 to 29, wherein the first bit comprises bit 29 and wherein each additional bit XORed with bit 29 of the first floating point value comprises bits 25 to 28 and wherein the bits of the other floating point values XORed with bit 29 of the first floating point value comprise bits 25 to 29.

17. The method as in claim 11 wherein causing the specified set of bit positions within the floating point data to be read out from the at least one register as 0s rather than 1s comprises performing an inversion operation to invert the specified set of bit positions.

18. The method as in claim 11 wherein the graphics data comprises Red Green Blue Alpha (RGBA) data.

19. The method as in claim 18 wherein floating point values of the RGBA data comprise normalized 32-bit single-precision floating point values ranging from 0 to 1.

20. The method as in claim 19 wherein the specified set of bit positions known to have a high correlation comprises a specified portion of an exponent of the 32-bit single precision floating point value.

21. The method as in claim 20 wherein the specified set of bit positions comprises bits 25 to 29.

22. A system comprising:
a memory to store instructions and graphics data comprising floating point values;
a cache having a plurality of cache levels to cache the instructions and graphics data;
a network interface communicatively couple the system over a network;
an input/output interface to receive input from a user and responsively cause operations including graphics operations to be performed; and
a graphics processor unit (GPU) to process the graphics data including the floating point data;
a set of registers, at least one of the registers of the set partitioned to store the floating point data; and
encode/decode logic to reduce a number of binary 1 values being read from the at least one register, the encode/decode logic comprising a set of exclusive OR (XOR) gates to cause a specified set of bit positions within the floating point data to be read out as 0s rather than 1s, wherein XOR gates are applied by XORing a first bit within the specified set of bit positions for a first floating point value with each additional bit within the specified set of bit positions of the first floating point value.

23. The system as in claim 22 wherein each floating point value comprises a 32-bit single precision floating point value, wherein the specified set of bit positions comprises bits 25 to 29, wherein the first bit comprises bit 29 and wherein each additional bit XORed with bit 29 comprises bits 25 to 28.

24. The system as in claim 23 wherein the first bit within the specified set of bit positions of the first floating point value is also XORed with each bit within the specified set of bit positions with a plurality of other floating point values.

25. The system as in claim 24 wherein the bits of the other floating point values XORed with bit 29 of the first floating point value comprise bits 25 to 29.

\* \* \* \* \*